United States Patent
Nagasawa

(10) Patent No.: US 9,244,321 B2
(45) Date of Patent: Jan. 26, 2016

(54) ELECTRO-OPTICAL DEVICE AND ELECTRONIC APPARATUS

(71) Applicant: Seiko Epson Corporation, Tokyo (JP)

(72) Inventor: Hitoya Nagasawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/501,687

(22) Filed: Sep. 30, 2014

(65) Prior Publication Data
US 2015/0103284 A1    Apr. 16, 2015

(30) Foreign Application Priority Data
Oct. 11, 2013  (JP) .................................. 2013-213467

(51) Int. Cl.
| G02F 1/136 | (2006.01) |
| G02F 1/1362 | (2006.01) |
| G02F 1/1343 | (2006.01) |
| G02F 1/1333 | (2006.01) |

(52) U.S. Cl.
CPC .... *G02F 1/136209* (2013.01); *G02F 1/134336* (2013.01); *G02F 1/136227* (2013.01); *G02F 2001/133388* (2013.01)

(58) Field of Classification Search
CPC .............. G02F 1/136204; G02F 1/136213; G02F 1/136209; G02F 1/133512; G02F 1/136227; G02F 1/136286; G02F 1/13629; G02F 1/136295
USPC ................................................ 349/41–47, 52
See application file for complete search history.

(56) References Cited

U.S. PATENT DOCUMENTS

| 8,102,497 B2* | 1/2012 | Fujikawa ........... G02F 1/136227 257/59 |
| 8,194,217 B2* | 6/2012 | Yoshii ............... G02F 1/134336 349/139 |
| 2003/0076459 A1* | 4/2003 | Murade ............. G02F 1/133512 349/111 |
| 2005/0078240 A1* | 4/2005 | Murade ............. G02F 1/136209 349/110 |
| 2007/0296899 A1* | 12/2007 | Murade .................. G02F 1/1339 349/139 |
| 2014/0313448 A1* | 10/2014 | Kinoe ............... G02F 1/136209 349/46 |
| 2015/0194116 A1* | 7/2015 | Lee ...................... G09G 3/3685 345/88 |

FOREIGN PATENT DOCUMENTS

JP        2005-077636 A       3/2005

* cited by examiner

*Primary Examiner* — Anne Hines
*Assistant Examiner* — Jose M Diaz
(74) *Attorney, Agent, or Firm* — ALG Intellectual Property, LLC

(57) ABSTRACT

In a display pixel of an element substrate of an electro-optical device, a first gate electrode of a first transistor is electrically connected to a scanning line via a first contact hole of an insulating film. In a dummy pixel, a light blocking layer of the same layer as the scanning line is formed, and a second gate electrode of a second transistor is electrically connected to a scanning line via a second contact hole. A gap between the end portion of the second contact hole and the end portion of the scanning line is wider than the gap between the end portion of the first contact hole and the end portion of the scanning line.

14 Claims, 13 Drawing Sheets

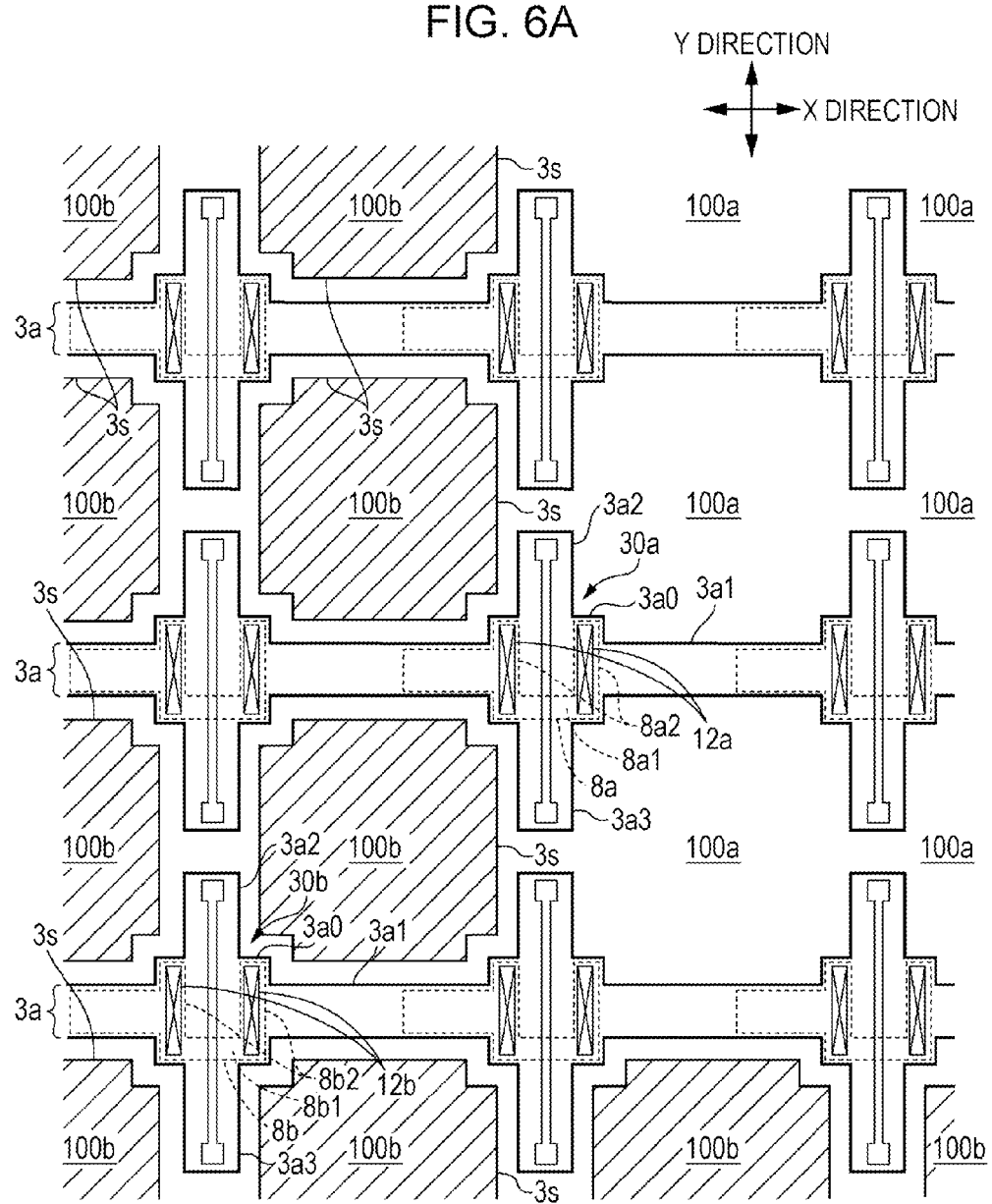

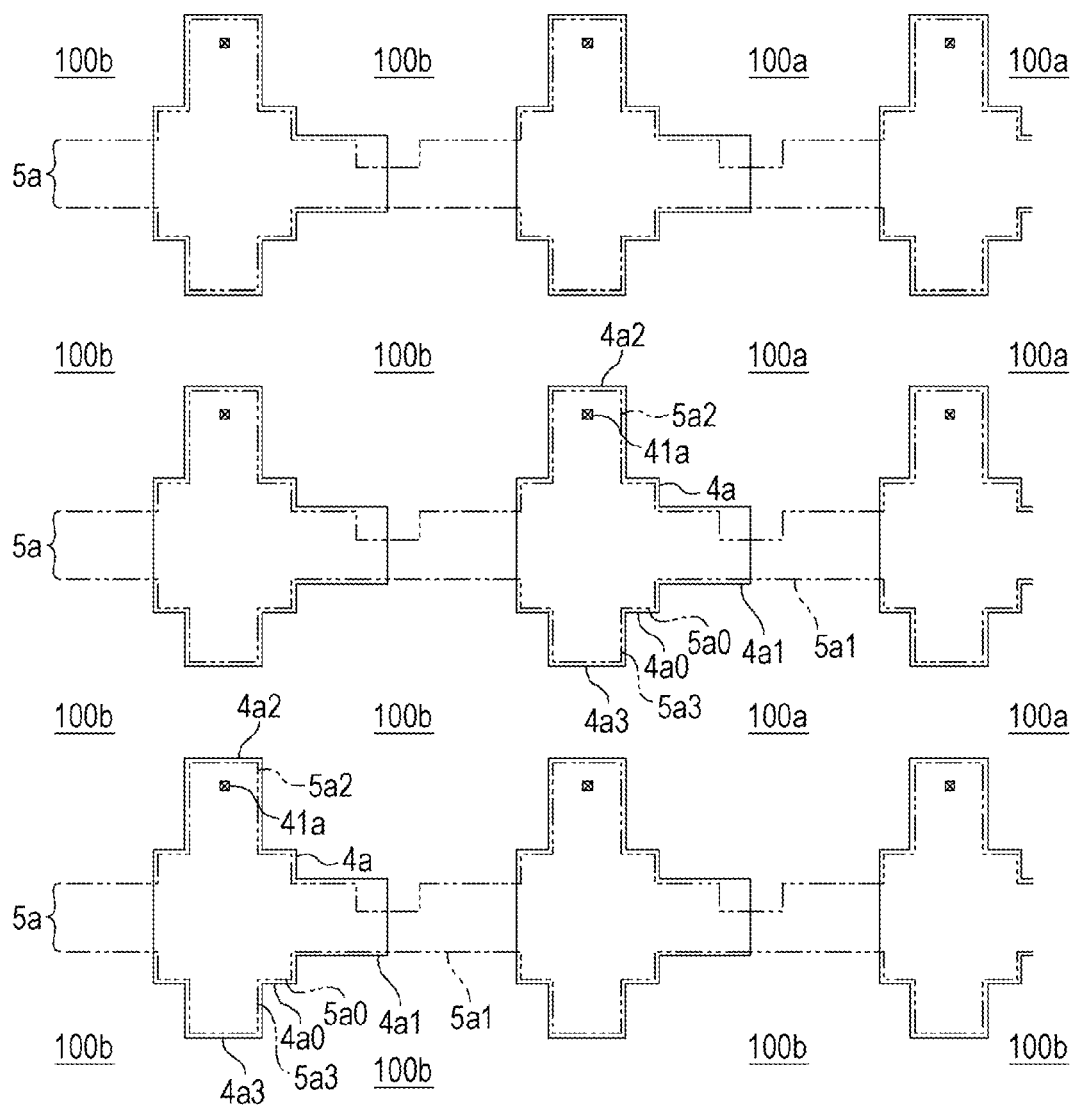

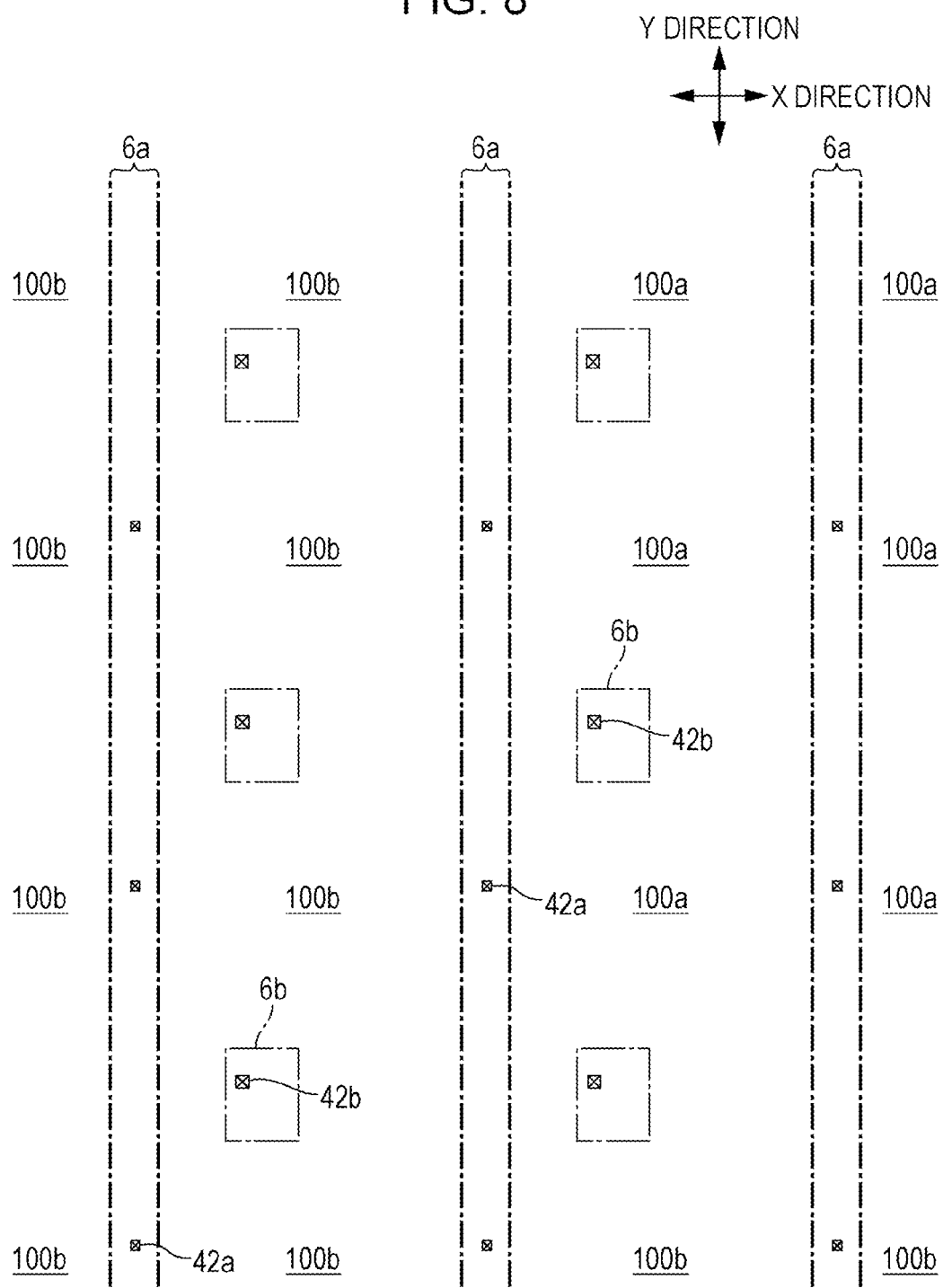

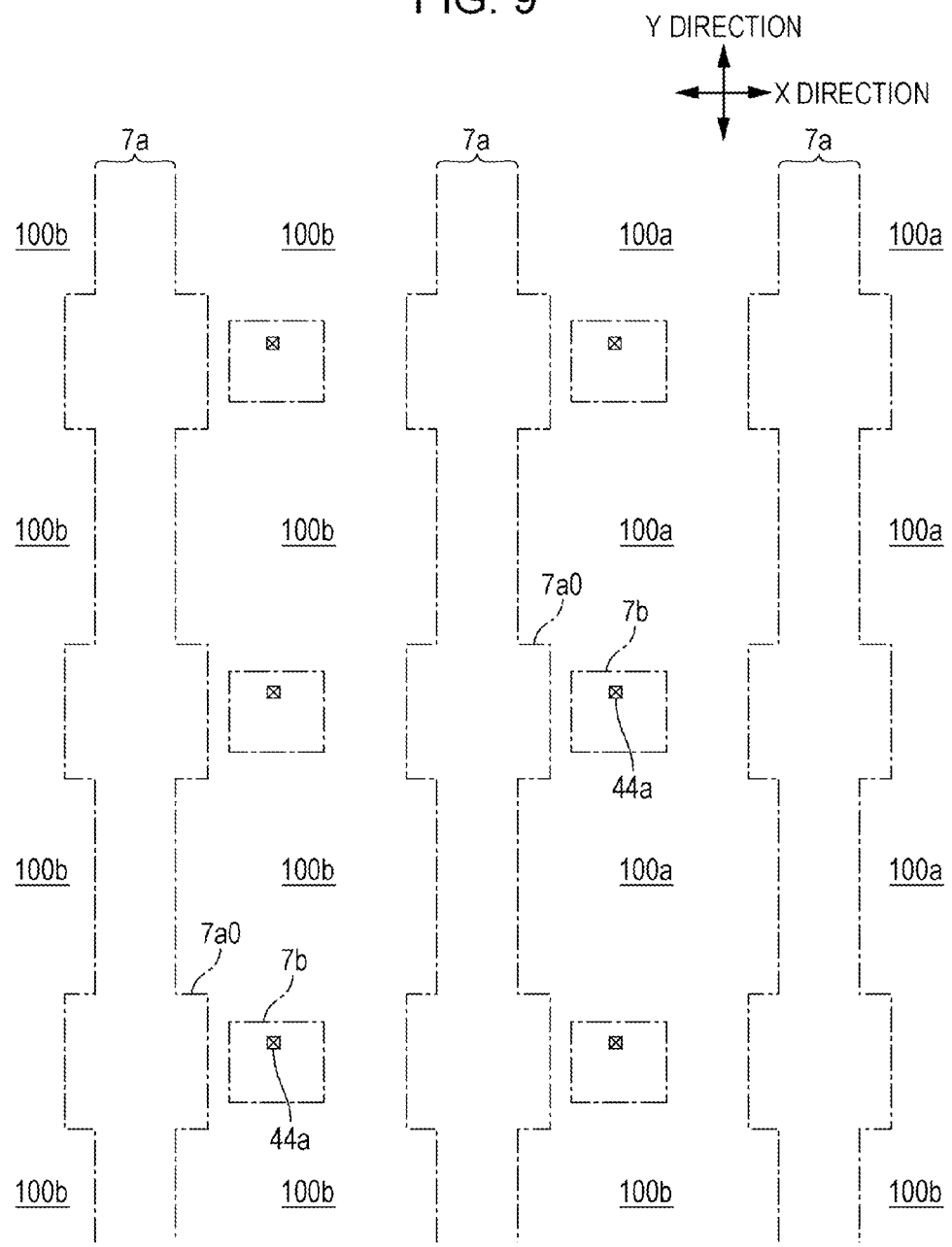

ns line breaks, and the display quality is lowered. When the size of the contact hole of the dummy pixel increases, as a result of a large concavity occurring on the upper layer side, the capacitance value of a storage capacitor formed on the upper layer side fluctuates, and the display quality lowers.
ELECTRO-OPTICAL DEVICE AND ELECTRONIC APPARATUS

BACKGROUND

1. Technical Field

The present invention relates to an electro-optical device in which a light blocking layer that overlaps a pixel electrode is provided on a dummy pixel, and an electronic apparatus including the electro-optical device.

2. Related Art

In an electro-optical device, such as a liquid crystal device, a display pixel provided in a display region includes a transistor electrically connected to a scanning line and a pixel electrode electrically connected to the transistor. For the purpose of increasing the quality of the display at the end portions of the display region, a dummy pixel including a transistor electrically connected to the scanning line and a pixel electrode electrically connected to the transistor is provided at the peripheral region that is adjacent at the outer side to the display region, and, for example, a black solid image is displayed in the dummy pixel. However, in a case in which a dummy pixel is provided, since there are cases in which a portion of the light infiltrating from the oblique direction passes through, a structure is proposed in which a light blocking layer that overlaps the pixel electrode is provided in the dummy pixel (JP-A-2005-77636).

In JP-A-2005-77636, a configuration is adopted in which a scanning line, an insulating film and a transistor are provided in this order between a substrate and the pixel electrode, and the gate electrode of the transistor is electrically connected to the scanning line via a contact hole formed in the insulating film. A configuration is adopted in which a light blocking layer is provided between the insulating film and the substrate.

In a case in which a light blocking layer is provided on the dummy pixel as in the configuration disclosed in JP-A-2005-77636, when a configuration is adopted in which the gate electrode of the transistor is electrically connected to the scanning line via a contact hole formed in the insulating film, a problem arises in that defects stemming from new causes occur. As a result of investigating the problems, the inventors of the present application discovered that because the distribution of the light blocking layer changes rapidly between the peripheral region in which the dummy pixel is provided and the display region, it becomes easy for exposure abnormalities to occur at locations adjacent to the display region among the peripheral region in a subsequent exposure step in which the light blocking layer is formed. For example, in a step in which a contact hole that allows the scanning line and gate electrode to be electrically connected, when exposure abnormalities occur in a case of exposure for forming an etching mask, the size of the contact hole of the dummy pixel increases. Therefore, the insulating film (insulating film between the gate electrode and the light blocking layer in the contact hole) between the contact hole and the light blocking layer becomes thin in the dummy pixel, a stress that occurs at the peripheral edge of the light blocking layer caused by the thermal history in the manufacturing step is added to the scanning line, and cracks occur in the scanning line. As a result, the scanni

SUMMARY

An advantage of some aspects of the invention is to provide an electro-optical device able to suppress the occurrence of defects stemming from providing a light blocking layer on a dummy pixel, and an electronic apparatus including the electro-optical device.

According to a first aspect of the invention, there is provided an electro-optical device including a scanning line provided between a substrate and an insulating film; a display pixel that includes a first transistor provided on a side of the insulating film opposite to the scanning line and a first pixel electrode electrically connected to the first transistor, in a display region; and a dummy pixel that includes a second transistor provided on a side of the insulating film opposite to the scanning line, a second pixel electrode electrically connected to the second transistor, and a light blocking layer that overlaps the second pixel electrode between the substrate and the insulating film, in an area adjacent to the display region, in which the first transistor includes a first gate electrode electrically connected via a first contact hole formed in the insulating film, the second transistor includes a second gate electrode that is electrically connected via a second contact hole formed in the insulating film, and a gap between an end portion of the second contact hole and an end portion of the scanning line is wider than a gap between an end portion of the first contact hole and an end portion of the scanning line in at least one of a first direction in which the scanning line extends and a second direction which intersects the extension direction of the scanning line.

In the aspect, a light blocking layer that overlaps the second pixel electrode is provided on the dummy pixel provided in the region adjacent to the display region. Therefore, it is possible to prevent image quality being lowered by light passing through the dummy pixel. In the dummy pixel adjacent to the display region, although exposure abnormalities occur stemming from rapid changes in the distribution of the light blocking layer and the second contact hole that allows the scanning line and the second gate electrode to be electrically connected becomes larger than the design value, according to the aspect of the invention, the gap between the end portion of the second contact hole and the end portion of the scanning line is widened at the design stage so as to correct therefore. Therefore, even in a case in which the second contact hole becomes larger than the design value, since it is possible to ensure a sufficient gap between the end portion of the second contact hole and the end portion of the scanning line, the insulating film (insulating film between the second gate electrode and the light blocking layer in the second contact hole) between the second contact hole and the light blocking layer is thick. Therefore, even if stress occurs at the peripheral edge of the light blocking layer stemming from the thermal history in the manufacturing steps, it is possible to suppress the occurrence of cracks in the scanning line due to the stress. Accordingly, since it is difficult for breaks in the scanning line to occur, it is possible to suppress the occurrence of defects stemming from breaks in the scanning line.

In this case, it is preferable that a dimension in the first direction and a dimension in the second direction of first contact hole and the second contact hole be different, and a gap between an end portion of the second contact hole and an end portion of the scanning line be wider than a gap between an end portion of the first contact hole and an end portion of the scanning line in a direction of the larger dimension of the first direction and the second direction. Since the influence of a lowering in precision during exposure is large in the direction of the larger dimension, it is preferable that the gap between the end portion of the second contact hole and the end portion of the scanning line be wide in a direction in which the influence is large.

In this case, the gap between the end portion of the second contact hole and the end portion of the scanning line in the second direction may be wider than the gap between the end portion of the first contact hole and the end portion of the scanning line.

In this case, it is preferable that the gap between the end portion of the second contact hole and the end portion of the scanning line be 1.10 times or more and 1.50 times or less the gap between the end portion of the first contact hole and the end portion of the scanning line. When the gap between the end portion of the second contact hole and the end portion of the scanning line is too wide, the effect of preventing infiltration of light to the second transistor is reduced by the second contact hole; however, if the gap is suppressed to 1.50 time or less than the gap between the end portion of the first contact hole and the end portion of the scanning line, it is possible to prevent the infiltration of light to the second transistor.

In this case, it is preferable that the planar sizes of the first gate electrode and the second gate electrode be the same, and the planar size of the second contact hole be smaller than the planar size of the first contact hole. According to the configuration, even if a large design modification is not performed, it is possible to widen the gap between the end portion of the second contact hole and the end portion of the scanning line.

In this case, the first contact hole may be provided at two locations on both sides of the first transistor that interpose the semiconductor layer therebetween, and the second contact hole may be provided at two locations on both sides of the second transistor that interpose the semiconductor layer therebetween.

In this case, it is preferable that the scanning line and the light blocking layer be formed from the same layer. According to the configuration, it is possible to form the scanning line and the light blocking layer at the same time.

The electro-optical device according to the aspects of the invention is used in various electronic apparatuses. Among the electronic apparatuses, a projection-type display device includes a light source portion for supplying light to an electro-optical device, and a projection optical system that projected light modulated by the electro-optical device.

BRIEF DESCRIPTION OF THE DRAWINGS

The invention will be described with reference to the accompanying drawings, wherein like numbers reference like elements.

FIGS. 6A to 6C are explanatory diagrams illustrating the planar configuration of the first transistor and the like, shown in FIG. 4.

FIG. 7 is an explanatory diagram illustrating the planar configuration of a storage capacitor or the like shown in FIG. 4.

FIG. 8 is an explanatory diagram illustrating the planar configuration of a data line or the like shown in FIG. 4.

FIG. 9 is an explanatory diagram illustrating the planar configuration of an upper light blocking layer or the like shown in FIG. 4.

DESCRIPTION OF EXEMPLARY EMBODIMENTS

Figure 1A:
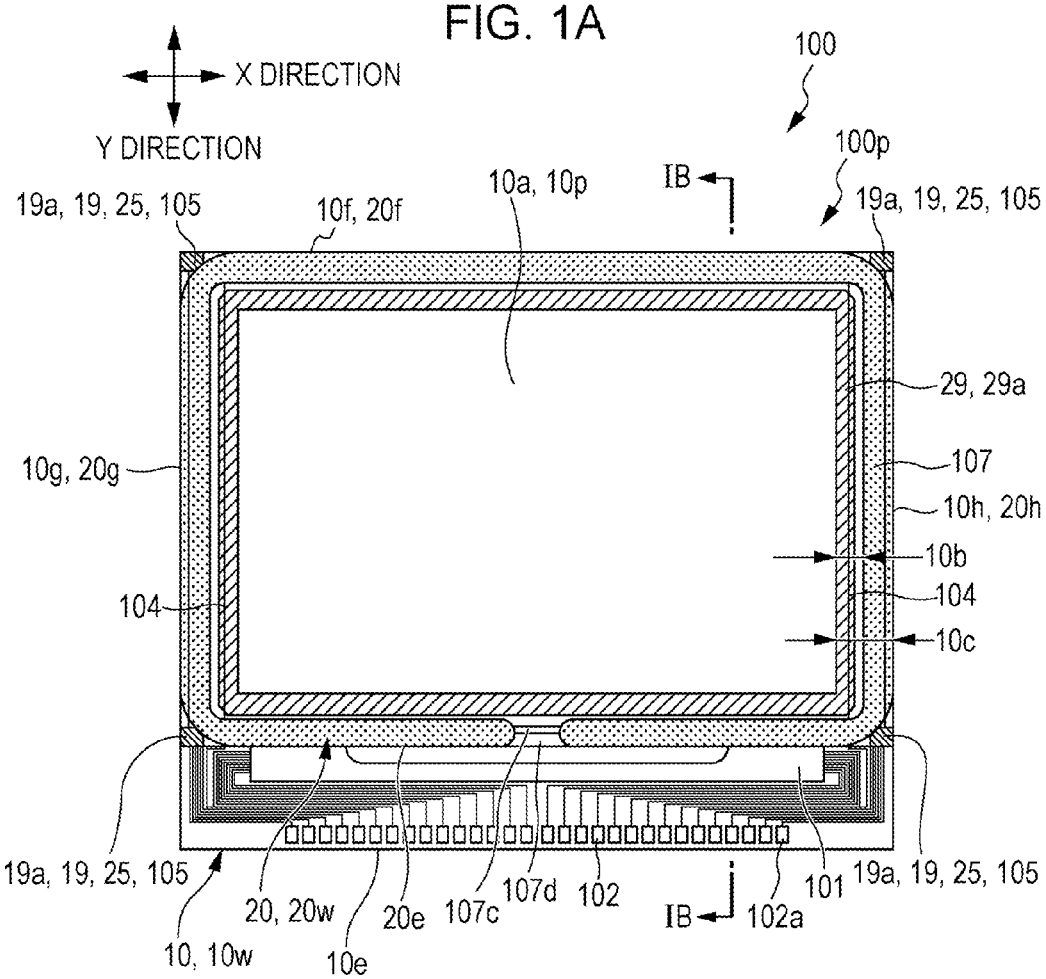
FIGS. 1A and 1B are explanatory diagrams illustrating a liquid crystal panel of an electro-optical device according to an embodiment of the invention.

The electro-optical device according to an embodiment of the invention will be described with reference to the drawings. In the drawings referenced in the following description, the scale is changed for each layer and each member in order to make each layer and each member a visually recognizable size in the drawings. In the drawings referenced in the following description, the numbers of the pixel electrodes, scanning lines, data lines, and the like, are reduced for display. Description is provided in which, from the first direction and second direction that intersect each other in the in-plane direction of the liquid crystal panel, the first direction is the X direction and the second direction is the Y direction.

Figure 1B:
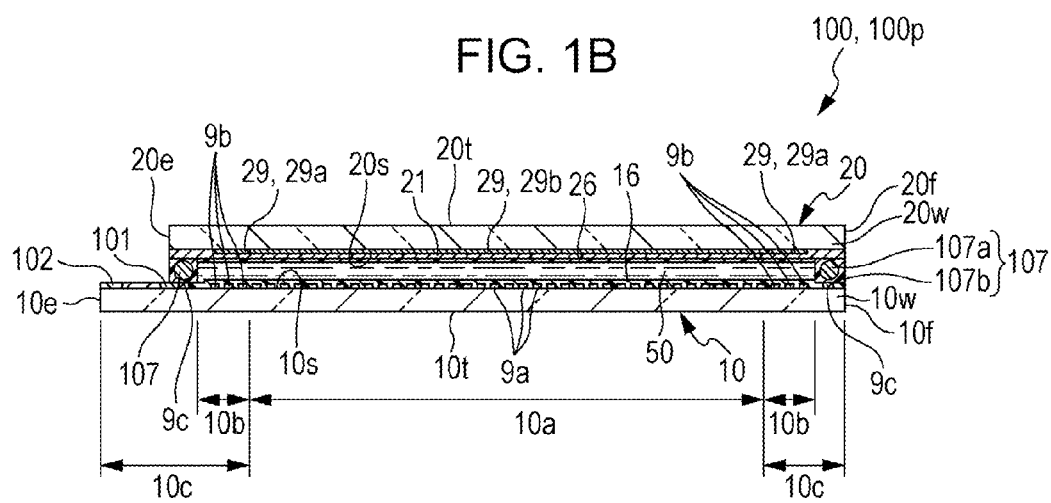
Figure 2:
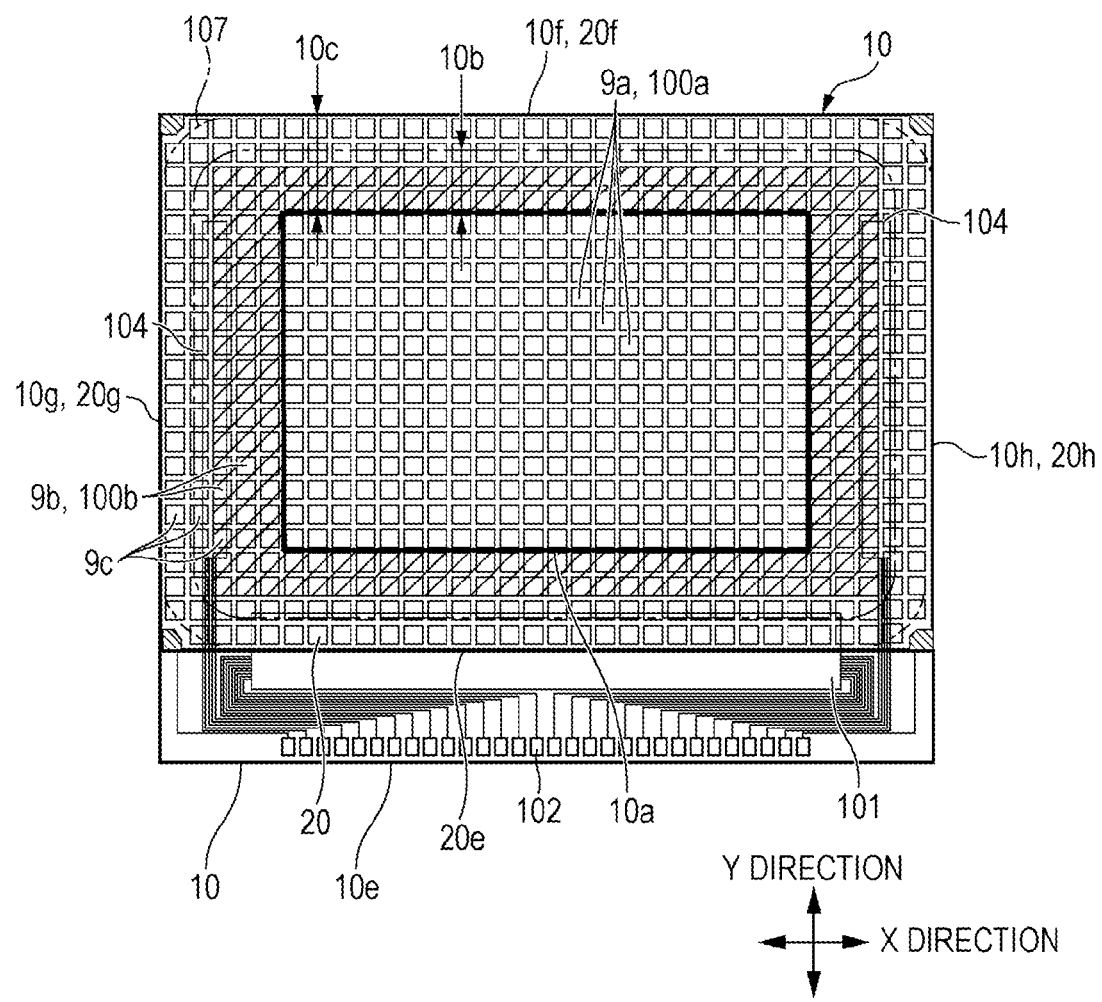
FIG. 2 is an explanatory diagram illustrating the positional relationship of each constituent element of the liquid crystal panel of the electro-optical device according to the embodiment of the invention.

FIGS. 1A and 1B are explanatory diagrams a liquid crystal panel of the electro-optical device according to the embodiment of the invention. FIGS. 1A and 1B are a planar diagram in which the liquid crystal panel is viewed from the counter substrate side and a cross-sectional diagram taken along line IB-IB in FIG. 1A, respectively. FIG. 2 is an explanatory diagram illustrating the positional relationship of each constituent element of the liquid crystal panel of the electro-optical device according to the embodiment of the invention.

As shown in FIGS. 1A to 2, the electro-optical device 100 of the embodiment includes a liquid crystal panel 100p. The liquid crystal panel 100p includes an element substrate 10, a counter substrate 20 arranged opposing the element substrate 10, and a seal material 107 provided between the element substrate 10 and the counter substrate 20. The element substrate 10 and the counter substrate 20 are bonded by the seal material 107 with a predetermined gap interposed. In the embodiment, the seal material 107 is also provided in a frame shape so as to follow the outer edge of the counter substrate 20. In the seal material 107, a gap material 107a, such as glass fibers or glass beads, is mixed in an adhesive 107b formed from a photocurable resin, thermosetting resin, or the like, and the gap between the element substrate 10 and the counter substrate 20 is regulated by the gap material 107a. In the liquid crystal panel 100p, a liquid crystal layer 50 (electro-optical medium layer) formed from various liquid crystal materials (electro-optical medium) is held in a region surrounded by the seal material 107 from between the element substrate 10 and the counter substrate 20. In the embodiment, a discontinuous portion used as a liquid crystal fill port 107c is formed in the seal material 107, and the liquid crystal fill port 107c is sealed by a sealing material 107d after pouring the liquid crystal material.

In the liquid crystal panel 100p, both of the element substrate 10 and the counter substrate 20 are squares, and a first substrate 10w which is a substrate main body of the element substrate 10 and a second substrate 20w which is a substrate main body of the counter substrate 20 are also squares. The element substrate 10 (first substrate 10w) includes two sides 10e and 10f (end portions) opposing each other in the Y direction (second direction) and two sides 10g and 10h (end portions) opposing each other in the X direction (first direction). The counter substrate 20 (second substrate 20w) includes two sides 20e and 20f (end portions) opposing each other in the Y direction (second direction) and two sides 20g and 20h (end portions) opposing each other in the X direction. The display region 10a is provided as a square region in the approximate center of the liquid crystal panel 100p, and the seal material 107 is provided in a substantially square shape according to the shape of the display region 10a. The outer side of the display region 10a becomes a square frame-shaped outer peripheral region 10c.

On the element substrate 10, on the outer peripheral region 10c, a data line driving circuit 101 and a plurality of terminals 102 are formed along the side 10e positioned on one side in the Y axis direction in the element substrate 10, and a scanning line driving circuit 104 is formed along each of the other sides 10g and 10h that neighbor the side 10e. The terminal 102 is connected to a flexibly wiring substrate (not shown), and various potentials and various signals are input to the element substrate 10 from an external control circuit via the flexible wiring substrate.

Although described in detail later with reference to FIG. 4 or the like, a first pixel electrode 9a, a first transistor 30a, or the like, described later with reference to FIGS. 3A and 3B or the like, are arranged in a matrix pattern in the display region 10a on the side of the one surface 10s opposing the counter substrate 20 among the one surface 10s and the other surface 10t of the element substrate 10. Accordingly, the display region 10a is configured as a pixel electrode arrangement region 10p in which the first pixel electrode 9a is arranged in a matrix pattern. In the element substrate 10 with this configuration, an alignment film 16 is formed on the counter substrate 20 side with respect to the first pixel electrode 9a.

On the side of the one surface 10s of the element substrate 10, a plurality of second pixel electrodes 9b is formed in the peripheral region 10b interposed by the display region 10a and the seal material 107 from the outer peripheral region 10c, and a plurality of third pixel electrodes 9c is formed in the region interposed by the peripheral region 10b in which the second pixel electrodes 9b are arranged and the sides 10e, 10f, 10g, and 10h of the element substrate 10. The third pixel electrodes 9c are formed in a region that overlaps the seal material 107, the scanning line driving circuit 104 and the data line driving circuit 101. Whereas the first pixel electrodes 9a directly contribute to the display, the second pixel electrodes 9b and the third pixel electrodes 9c are dummy pixel electrodes that do not directly contribute to the display.

Therefore, the region in which the first pixel electrode 9a is formed is configured as a display pixel 100a that directly contributes to display, and a first transistor 30a, described later, is formed therein. The region in which the second pixel electrode 9b is formed is configured as a dummy pixel 100b that ordinarily performs black display, and a second transistor 30b, described later, is formed therein. In contrast thereto, the third pixel electrode 9c, for example, has the function of increasing the adhesiveness of the alignment film 16 by enlarging the contact area between the alignment film 16 and the foundation without a transistor, or the like, being formed between the third pixel electrode 9C and first substrates 10w.

From the one surface 20s and the other surface 20t of the counter substrate 20, a common electrode 21 is formed on the side of the one surface 20s opposing the element substrate 10. The common electrode 21 is formed over substantially the entire surface of the counter substrate 20 or spans the plurality of display pixels 100a as a plurality of band-like electrodes. In the embodiment, the common electrode 21 is formed over substantially the entire surface of the counter substrate 20.

On the side of the one surface 20s of the counter substrate 20, a light blocking layer 29 is formed on the lower layer side (opposite side to the element substrate 10) of the common electrode 21, and an alignment film 26 is formed on the upper layer side (element substrate 10 side) of the common electrode 21. The light blocking layer 29 is formed as frame part 29a that extends along the outer peripheral edge of the display region 10a, and the display region 10a is regulated by the inner peripheral edge of the light blocking layer 29. The light blocking layer 29 is formed as a black matrix portion 29b that overlaps the inter-pixel region interposed by adjacent first pixel electrodes 9a. The frame part 29a is formed at a position that overlaps with the third pixel electrode 9c, and the outer peripheral edge of the frame part 29a is at a position separated by a gap from the inner peripheral edges of the seal material 107. Accordingly, the frame part 29a and the seal material 107 do not overlap.

In the liquid crystal panel 100p, an electrode for inter-substrate conduction 25 is formed at four corner parts on the side of the one surface 20s of the counter substrate 20 further to the outside than the seal material 107, and an electrode for inter-substrate conduction 19 is formed at a position opposing the four corner parts (electrode for inter-substrate conduction 25) of the counter substrate 20 on the side of the one surface 10s of the element substrate 10. In the embodiment, the electrode for inter-substrate conduction 25 is formed from a portion of the common electrode 21. A common potential Vcom is applied to the electrode for inter-substrate conduction 19. An inter-substrate conduction material 19a is arranged between the electrode for inter-substrate conduction 19 and the electrode for inter-substrate conduction 25, and the common electrode 21 of the counter substrate 20 is electrically connected to the element substrate 10 side via the electrode for inter-substrate conduction 19, the inter-substrate conduction material 19a and the electrode for inter-substrate conduction 25. The inter-substrate conduction portion 105 is formed in this way, and a common potential Vcom is applied from the element substrate 10 side to the common electrode 21. The seal material 107 is provided along the outer peripheral edge of the counter substrate 20 with substantially the same width dimension; however, in the vicinity of the corner of the counter substrate 20, the seal material 107 is provided so as to pass through the inner side avoiding the inter-substrate conduction portion 105.

In the embodiment, the electro-optical device 100 is a transmissive-type electro-optical device, and the first pixel electrode 9a and the common electrode 21 are formed by a transparent conductive film, such as an Indium Tin Oxide (ITO) film or and Indium Zinc Oxide (IZO) film. In the transmissive-type electro-optical device 100, for example, an image is displayed by light incident from the counter substrate 20 side being modulated while being emitted from the element substrate 10 side. In a case in which the electro-optical device 100 is a reflective-type electro-optical device, the common electrode 21 is formed by a transparent conductive film, such as an ITO film or an IZO film, and the first pixel electrode 9a is formed by a reflective conductive film, such as an aluminum film. In the reflective-type electro-optical device 100, an image is displayed by light incident from the counter substrate 20 side from among the element substrate 10 and the counter substrate 20, being modulated while being reflected and emitted by the element substrate 10.

The electro-optical device 100 is able to be used in a color display device of an electronic apparatus, such as a mobile computer or mobile telephone, and in this case, a color filer (not shown) is formed on the counter substrate 20. The electro-optical device 100 is able to be used as an electronic paper. In the electro-optical device 100, polarization film, a phase difference film, a polarization plate, or the like, is arranged with a predetermined orientation with respect to the liquid crystal panel 100p according to the type of liquid crystal layer 50 used, or the distinction of the normally white mode/normally black mode. The electro-optical device 100 is able to be used as an RGB light valve in the projection type display device (liquid crystal projector/electronic apparatus), described later. In this case, since each color of light separated via a dichroic mirror for RGB color separation is incident as projection light on the respective RGB electro-optical device 100, a color filer is not formed.

Electrical Configuration of Element Substrate 10

Figure 3A:
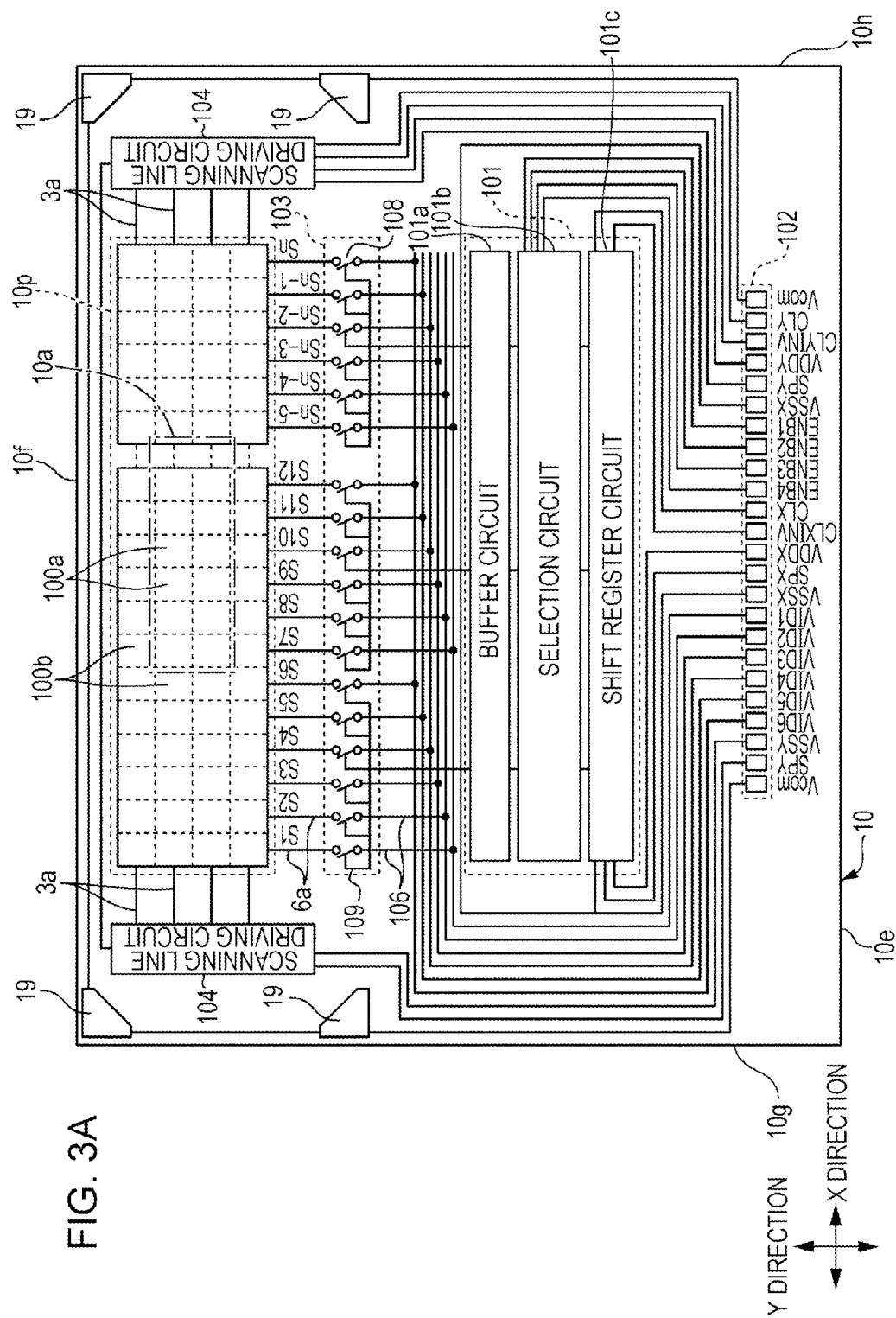
FIGS. 3A and 3B are explanatory diagrams illustrating an electrical configuration of an element substrate of the electro-optical device according to the embodiment of the invention.
Figure 3B:
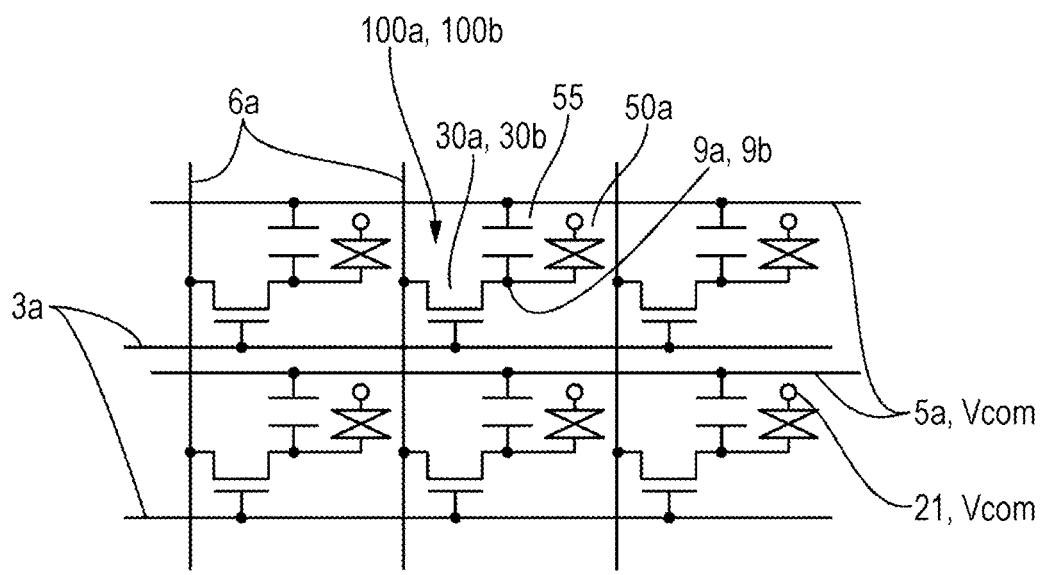

FIGS. 3A and 3B are explanatory diagrams illustrating an electrical configuration of the element substrate 10 of the electro-optical device 100 according to the embodiment of the invention; FIGS. 3A and 3B are explanatory diagrams illustrating a planar layout of a circuit and a wiring of the element substrate 10, and an explanatory diagram illustrating the electrical configuration of a pixel, respectively. In the following description, the signal name input to the element substrate 10 via the terminal 102 and signal wiring each have the same alphabetic symbol affixed after "signal" and "wiring L". For example, with respect to "clock signal CLX" that is a signal name, the corresponding signal wiring is "clock signal wiring LCLX". In the following description, the signal name input to the element substrate 10 via the terminal 102 and signal terminal each have the same alphabetic symbol affixed after "signal" and "terminal T". For example, with respect to "clock signal CLX" that is a signal name, the corresponding terminal 102 is "terminal TCLX".

As shown in FIGS. 3A and 3B, in the electro-optical device 100, the pixel electrode arrangement region 10p in which a plurality of display pixels 100a and a plurality of dummy pixels 100b are arranged in a matrix pattern is provided in the center region of the element substrate 10, and, from the pixel electrode arrangement region 10p, a region surrounded by the inner edge of the frame part 29a shown in FIG. 1B is the display region 10a. In the element substrate 10, a plurality of scanning lines 3a extending in the X direction and a plurality of data lines 6a extending in the Y direction are formed on the inside of the pixel electrode arrangement region 10p, and the display pixel 100a and the dummy pixel 100b are configured at a position corresponding to the intersection thereof.

A first transistor 30a (pixel switching element) formed from a field effect transistor, such as a thin film transistor, and a first pixel electrode 9a are formed in each of the plurality of display pixels 100a. The data line 6a is electrically connected to the source of the first transistor 30a, the scanning line 3a is electrically connected to the gate of the first transistor 30a, and the first pixel electrode 9a is electrically connected to the drain of the first transistor 30a.

The dummy pixel 100b has basically the same configuration as the display pixel 100a, and a second transistor 30b formed from a field effect transistor, such as a thin film transistor, and a second pixel electrode 9b are formed therein. The data line 6a is electrically connected to the source of the second transistor 30b, the scanning line 3a is electrically connected to the gate of the second transistor 30b, and the second pixel electrode 9b is electrically connected to the drain of the second transistor 30b.

In the element substrate 10, a scanning line driving circuit 104, a data line driving circuit 101, a sampling circuit 103, an electrode for inter-substrate conduction 19, a terminal 102 or the like are configured further toward the outer peripheral region 10c of the outer side than the pixel electrode arrangement region 10p, and a plurality of wirings extend from the terminal 102 toward the scanning line driving circuit 104, the data line driving circuit 101, the sampling circuit 103, and the electrode for inter-substrate conduction 19. The sampling circuit 103 is electrically connected to a plurality of data lines 6a, and the scanning line driving circuit 104 is electrically connected to a plurality of scanning lines 3a.

In the display pixel 100a and the dummy pixel 100b, the first pixel electrode 9a and the second pixel electrode 9b oppose the common electrode 21 formed on the counter substrate 20 described with reference to FIGS. 1A and 1B via the liquid crystal layer 50, and configure a liquid crystal capacitor 50a. In order to prevent fluctuation in the image signal held by the liquid crystal capacitor 50a, a storage capacitor 55 is added in parallel to the liquid crystal capacitor 50a to the display pixel 100a and the dummy pixel 100b. In the embodiment, in order to configure the storage capacitor 55, a capacitance line 5a extended spanning the plurality of display pixels 100a and the plurality of dummy pixel 100b is formed, and a potential Vcom is applied to the capacitance line 5a. It is possible to use the same potential as the common potential applied to the common electrode 21 as the potential Vcom.

The terminal 102 provided along the side 10e of the element substrate 10 is configured by a plurality of groups of terminals broadly classified into four uses of for a common potential line, for a scanning line driving circuit, for an image signal and for a data line driving circuit. Specifically, the terminal 102 includes a terminal TVcom for common potential wiring LVcom, and includes the terminal TSPY, the terminal TVSSY, the terminal TVDDY, the terminal TCLY, and the terminal TCLYINV for the scanning line driving circuit 104. The terminal 102 includes the terminals TVID1 to TVID6 for the image signals VID1 to VID6, and includes the terminal TVSSX, the terminal TSPX, the terminal TVDDX, the terminal TCLX, the terminal TCLXINV, the terminals TENB1 to TENB4 and the terminal TVSSX for the data line driving circuit 101.

The data line driving circuit 101 includes a shift register circuit 101c, a selection circuit 101b and a buffer circuit 101a. In the data line driving circuit 101, the shift register circuit 101c uses a negative power source VSSX and a positive power source VDDX supplied from an external control circuit via the terminal 102 (terminals TVSSX and TVDDX) and the wiring 105 (wirings LVSSX and LVDDX) as a power source, and begins a transfer operation based on a start signal SPX supplied from the external control circuit via the terminal 102 (terminal TSPX) and the wiring 105 (wiring LSPX). The shift register circuit 101c sequentially outputs the transfer signal to the selection circuit 101b at a predetermined timing, based on the clock signal CLX and the opposite-phase clock signal CLXINV supplied via the terminal 102 (terminals TCLX and TCLXINV) and the wiring 105 (wirings LCLX and LCLX-INV). The selection circuit 101b, also referred to as an "enable circuit", regulates each sampling period in the sampling circuit 103, described later, by restricting the pulse width of the transfer signal sequentially output from the shift register circuit 101c to the pulse width of the enable signals ENB1 to ENB4 supplied from the external control circuit via the terminal 102 (terminals TENB1 to TENB4) and the wiring 105 (wiring LENB1 to LENB4). More specifically, the selection circuit 101b is configured by a NAND circuit and an inverter provided corresponding to each stage of the shift register circuit 101c, a transfer signal sequentially output by the shift register circuit 101c is made high level, and selection control of the waveform on the time axis is performed such that the data line 6a is driven only when any one of the enable signals ENB1 to ENB4 becomes high level. The buffer circuit 101a supplies the transfer signal on which such waveform selection is performed to the sampling circuit 103 as a sampling circuit driving signal after buffering via the sampling circuit driving signal line 109.

The sampling circuit 103 is configured to include a plurality of switching elements 108 for sampling the image signal. In the embodiment, the switching element 108 is formed from a field effect transistor, such as a TFT. The data line 6a is electrically connected to the drain of the switching element 108, the sampling circuit driving signal line 109 is electrically connected to the data line driving circuit 101 at the gate of the switching element 108, along with the wiring 105 (image signals LVID1 to LVID6) being connected via the wiring 106 to the source of the switching element 108. The image signals VID1 to VID6 supplied to the wiring 105 (image signal lines LVID1 to LVID6) via the terminal 102 (terminals TVID1-VID6) is sampled by the sampling circuit 103 and supplied to each data line 6a as the image signals S1, S2, S3, ... Sn in response to the sampling circuit driving signal being supplied through the sampling circuit driving signal line 109 from the data line driving circuit 101. In the embodiment, the image signals S1, S2, S3, ... Sn correspond to respectively to the image signals VID1 to VID6 serial-parallel developed in six phases and are supplied to each group with respect to groups of six data lines 6a. The phase development number of the image signal is not limited to six phases, and, for example, the image signal developed in a plurality of phases, such as nine phases, twelve phases, twenty-four phases, and forty-eight phases, is supplied with respect to the group of data lines 6a in which the number corresponding to the development number is made one group.

The scanning line driving circuit 104 includes a shift register circuit and a buffer circuit as constituent elements. The scanning line driving circuit 104 uses a negative power source VSSY and a positive power source VDDY supplied from an external control circuit via the terminal 102 (terminals TVSSY and TVDDY) and the wiring (wirings LVSSY and LVDDY) as a power source, and begins a transfer operation of the internal shift register circuit based on a start signal SPY similarly supplied from the external control circuit via the terminal 102 (terminal TSPY) and the wiring (wiring LSPY). The scanning line driving circuit 104 applies a scanning signal in a pulsed manner in line sequence to the scanning line 3a at a predetermined timing based on a clock signal CLY and an opposite-phase clock signal CLYINV supplied via the terminal 102 (terminals TCLY and TCLYINV) and the wiring (wirings LCLY and LCLYINV).

A common potential wiring LVcom is formed on the element substrate 10 so as to pass through the four electrodes for inter-substrate conduction 19, and the common potential Vcom is supplied to the electrode for inter-substrate conduction 19 via the terminal 102 (terminal TVcom) and the common potential wiring LVcom.

In the electro-optical device 100 configured in this way, whereas an image is displayed in the display region 10a by applying predetermined image signal to the first pixel electrode 9a in the display pixel 100a, a solid black display is performed by applying the common potential Vcom to the second pixel electrode 9b of the dummy pixel 100b.

Specific Configuration of Display Pixel 100a

Figure 4:
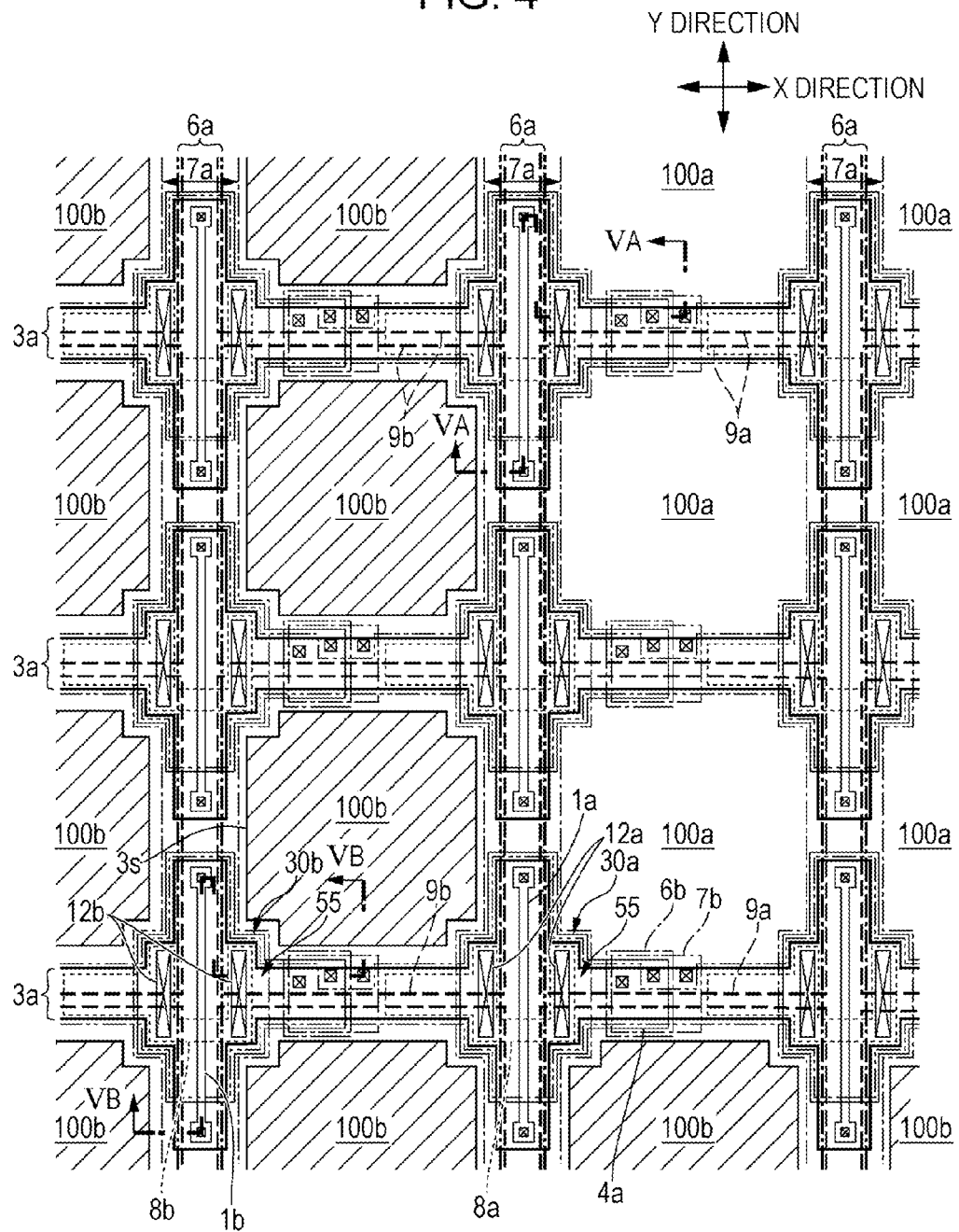
FIG. 4 is an explanatory diagram illustrating a planar configuration of a display pixel of the electro-optical device according to the embodiment of the invention.
Figure 5A:
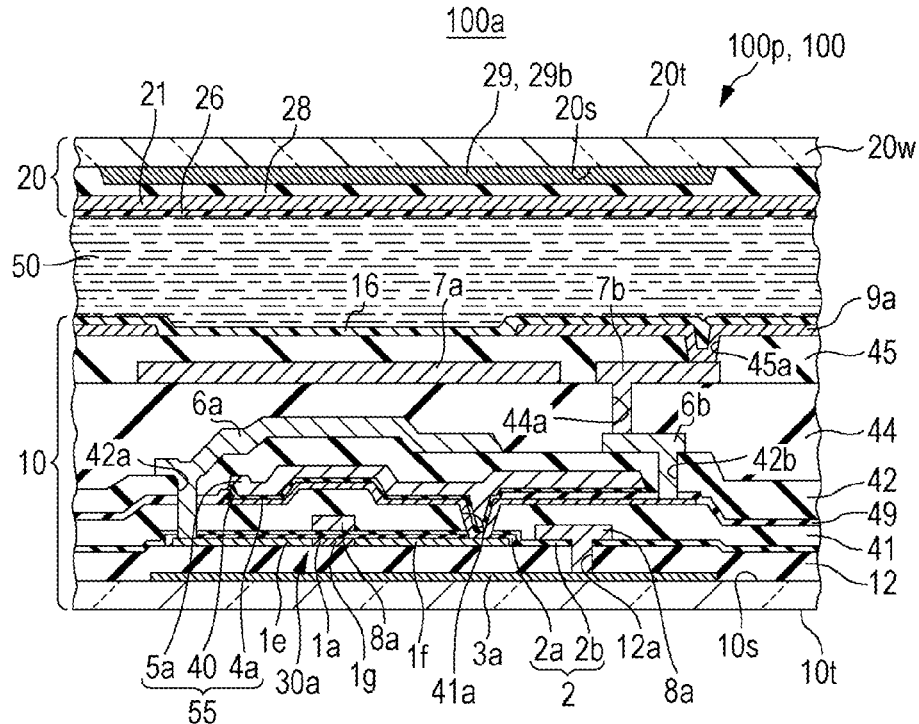
FIGS. 5A and 5B are explanatory diagrams illustrating a cross-sectional configuration of the display pixel of the electro-optical device according to the embodiment of the invention.
Figure 5B:
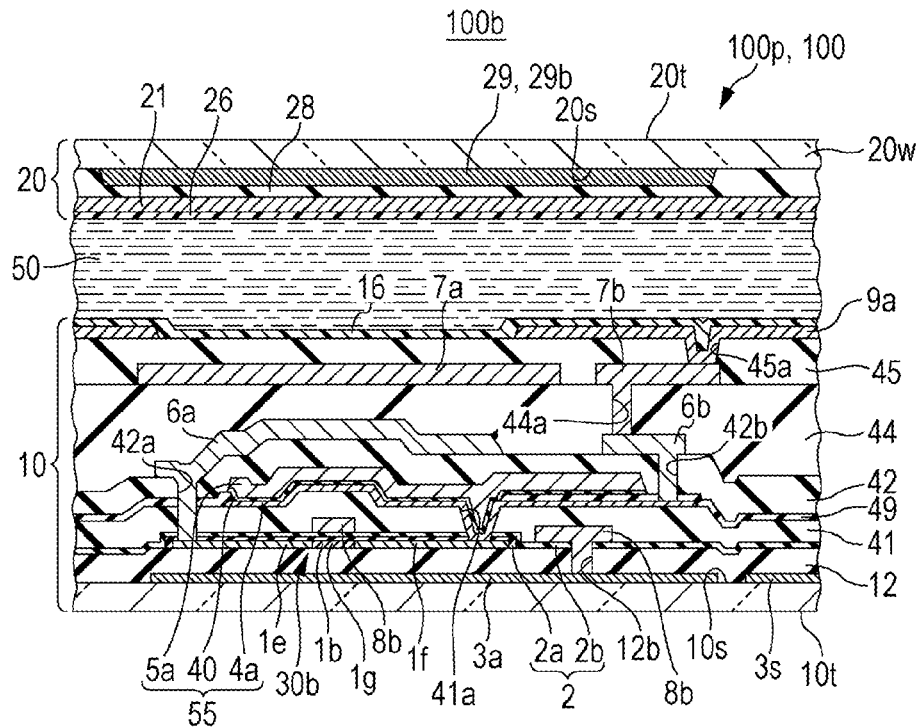

FIG. 4 is an explanatory diagram illustrating a planar configuration of a display pixel 100a of the electro-optical device 100 according to the embodiment of the invention, and a planar configuration of a plurality of adjacent display pixels 100a, or the like, is shown on the element substrate 10. FIGS. 5A and 5B are explanatory diagrams illustrating a cross-sectional configuration of a display pixel 100a of the electro-optical device 100 according to the embodiment of the invention. FIGS. 5A and 5B are a cross-sectional diagram of the display pixel 100a taken along line VA-VA, and a cross-sectional diagram of the dummy pixel 100b taken along line VB-VB, respectively.

Figure 6B:
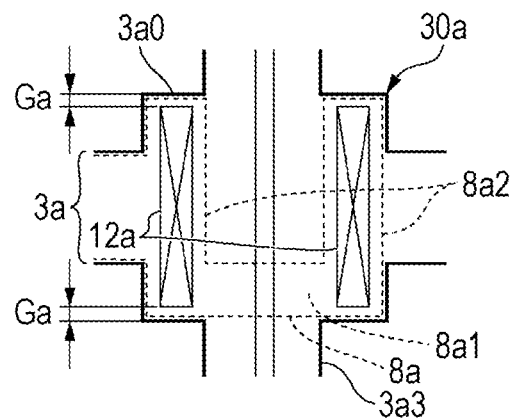
Figure 6C:
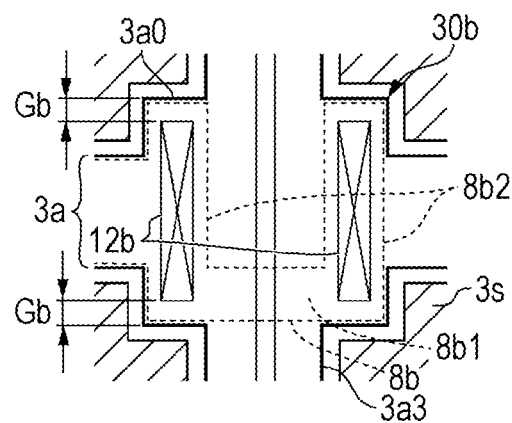
Figure 10:
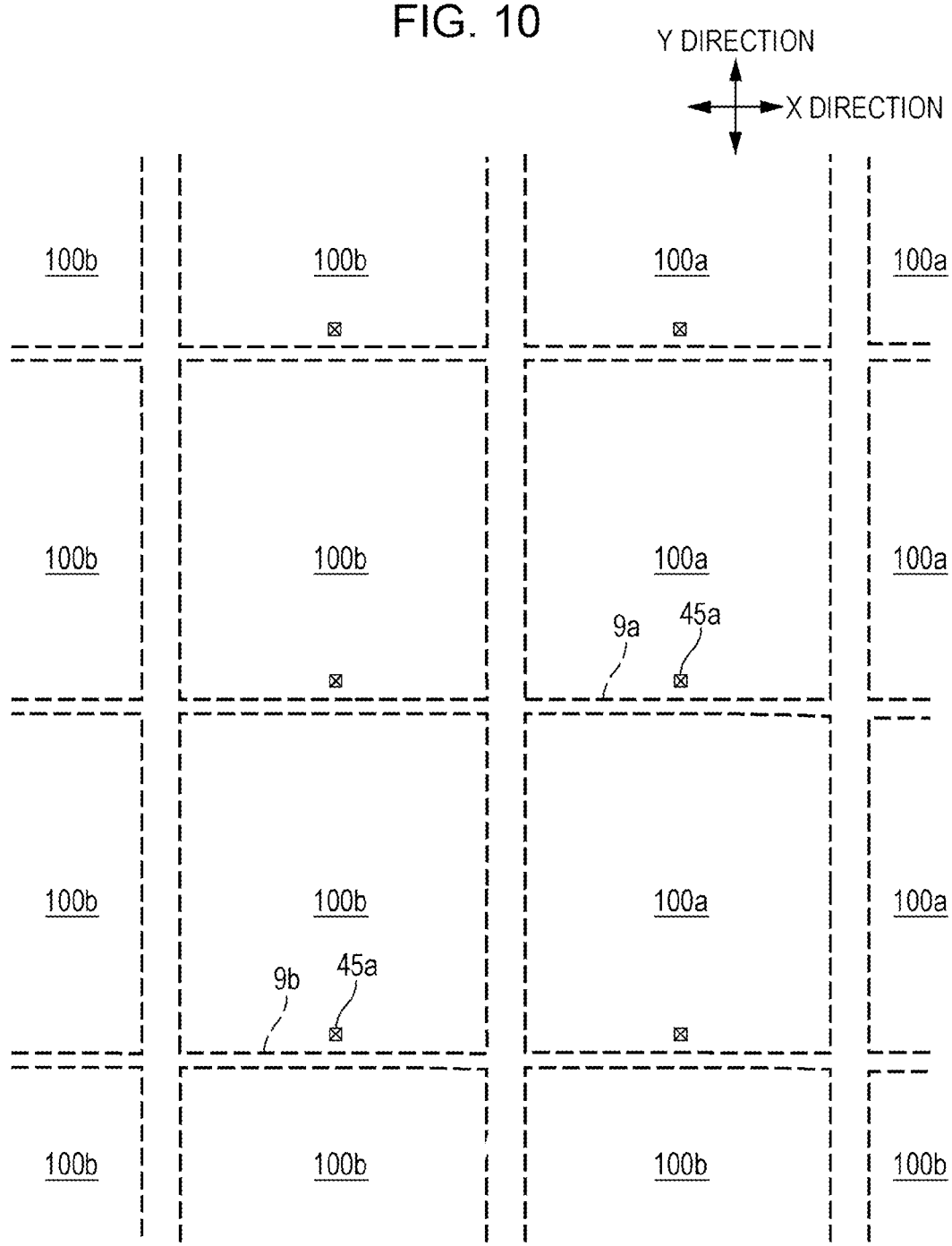
FIG. 10 is an explanatory diagram illustrating the planar configuration of a first pixel electrode or the like shown in FIG. 4.

FIGS. 6A to 6C are explanatory diagrams illustrating a planar configuration of a first transistor 30a, or the like, shown in FIG. 4. FIGS. 6A, 6B, and 6C are explanatory diagrams of adjacent first transistors 30a, or the like of a plurality of display pixels 100a, a plan view illustrating an enlargement of the first transistor 30a, and a plan view illustrating an enlargement of the second transistor 30b, respectively. FIG. 7 is an explanatory diagram illustrating the planar configuration of a storage capacitor 55 or the like shown in FIG. 4. FIG. 8 is an explanatory diagram illustrating the planar configuration of a data line 6a or the like shown in FIG. 4. FIG. 9 is an explanatory diagram illustrating the planar configuration of an upper light blocking layer 7a or the like shown in FIG. 4. FIG. 10 is an explanatory diagram illustrating the planar configuration of a first pixel electrode 9a or the like shown in FIG. 4.

In FIGS. 4 and 6A to 10, each layer is indicated by the following lines, scanning line 3a and lower light blocking layer 3s=thick solid line, first semiconductor layer 1a=long thin dashed line, first gate electrode 8a and second gate electrode 8b=dotted line, drain electrode 4a=thin solid line, capacitance line 5a=thin double-dotted dashed line, data line 6a and relay electrode 6b=thick single-dotted dashed line, upper light blocking layer 7a and relay electrode 7b=thin single-dotted dashed line, and first pixel electrode 9a and second pixel electrode 9b=thick dashed line. In the FIGS. 4 and 6A to 10, for the layers in which the end portions overlap each other when seen in plan view, the positions of the end portions are shifted so that the shape or the like of the layers is easily understood.

As shown in FIGS. 4 to 10, a first pixel electrode 9a is formed for each of the plurality of display pixels 100a on the one surface 10s opposing the counter substrate 20 (second substrate 20w) in the element substrate 10 (first substrate 10w), and the data line 6a and the scanning line 3a are formed along the interpixel region interposed by the adjacent first pixel electrodes 9a. In the embodiment, the interpixel region extends vertically and horizontally, and the scanning line 3a extends straight along the first interpixel region that extends in the X direction (first direction) among the interpixel regions, and the data line 6a extends straight along the second interpixel region that extends in the Y direction (second direction). The first transistor 30a is formed corresponding to the intersection of the data line 6a and the scanning line 3a, and, in the embodiment, the first transistor 30a is formed using the intersection region of the data line 6a and the scanning line 3a and the vicinity thereof. The capacitance line 5a is formed on the element substrate 10, and a common potential Vcom is applied to the capacitance line 5a. In the embodiment, the capacitance line 5a extends so as to overlap the scanning line 3a.

Below, the display pixel 100a will be described in detail centering on FIG. 5A, and also with reference to FIGS. 4 and 6A to 10.

As shown in FIG. 5A, the element substrate 10 includes a first pixel electrode 9a, a first transistor 30a, and an alignment film 16 formed on a substrate surface of the transparent first substrate 10w on the liquid crystal layer 50 side (one surface 10 side opposing the counter substrate 20), such as a quartz substrate or a glass substrate. The counter substrate 20 includes a light blocking layer 29, a common electrode 21 and an alignment film 26 formed on the surface (one surface 20s opposing the element substrate 10) of the transparent second substrate 20w on the liquid crystal layer 50 side, such as a quartz substrate or a glass substrate.

In the element substrate 10, a scanning line 3a formed from a conductive film, such as a conductive polysilicon film, a metal silicide film, a metal film or a metal compound film is formed on the one surface 10s side of the first substrate 10w. In the embodiment, the scanning line 3a is formed from a light blocking film, such as tungsten silicide (WSi), and, when light is reflected by another member after passing through the electro-optical device 100, prevents the occurrence of malfunctions stemming from a photoelectric current in the first transistor 30a due to reflected light being incident on the first semiconductor layer 1a.

On the one surface 10s side of the first substrate 10w, a transparent insulating film 12, such as a silicon oxide film, is formed on the upper layer side (counter substrate 20 side) of the scanning line 3a, and first transistor 30a including a first semiconductor layer 1a is formed on the surface side of the insulating film 12. The first transistor 30a includes a first semiconductor layer 1a in which the long side direction faces the extension direction of the data line 6a at a position that overlaps the data line 6a, and a first gate electrode 8a that overlaps the central part of the length direction of the first semiconductor layer 1a. The gate electrode 8a is formed from a conductive polysilicon film, a metal silicide film, a metal film or a metal compound film, and in the embodiment, the first gate electrode 8a is formed from a conductive polysilicon film. The first semiconductor layer 1a includes a channel region 1g opposing the first gate electrode 8a with the gate insulating layer 2 interposed, and includes a source region 1e and a drain region 1f on both sides of the channel region 1g. In the embodiment, the first transistor 30a includes an LDD structure. Accordingly, the source region 1e and the drain region 1f each include a low density region on both sides of the channel region 1g, and include a high density region in a region neighboring the opposite side of the channel region 1g with respect to low density region. A transparent gate insulating layer 2 is formed between the first semiconductor layer 1a and the first gate electrode 8a. The first semiconductor layer 1a is formed by a polysilicon film (polycrystalline silicon film). The gate insulating layer 2 is formed in a two layer structure including a first gate insulating layer 2a formed from a silicon oxide film in which the first semiconductor layer 1a is thermally oxidized, and a second gate insulating layer 2b formed from a silicon oxide film formed by a low pressure CVD method in temperature conditions of a temperature of 700° C. to 900° C.

As shown in FIG. 6A, the scanning line 3a includes a main line part 3a1 extended straight in the X direction and two sub-line parts 3a2 and 3a3 extending so as to overlap the data line 6a at the intersection portion with the data line 6a. The scanning line 3a includes a rectangular portion 3a0 in at an intersection portion with the data line 6a. As shown in FIGS. 6A and 6B, the first gate electrode 8a includes a first band-like portion 8a1 that overlaps the center part in the length direction of the first semiconductor layer 1a, and two second band-like portions 8a2 positioned at both sides in the X direction of the first semiconductor layer 1a and extend along the data line 6a from both ends of the first band-like portion 8a1, and the two second band-like portions 8a2 are electrically connected to the scanning line 3a via the two first contact holes 12a that pass through the gate insulating layer 2 and the insulating film 12.

Also in FIG. 5A, a transparent interlayer insulating film 41 formed from a silicon oxide film, such as NSG, PSG, BSG, and BPSG, is formed on the upper layer side (counter substrate 20 side) of the first gate electrode 8a, and a drain electrode 4a is formed on the upper layer of the interlayer insulating film 41. In the embodiment, the interlayer insulating film 41 is formed from a silicon oxide film. The drain electrode 4a is formed from a conductive film, such as a conductive polysilicon film, a metal silicide film, a metal film, or a metal compound film. In the embodiment, the drain electrode 4a is formed from a titanium nitride film. The drain electrode 4a is formed such that a portion overlaps the drain region 1f (source drain region of the pixel electrode side) of the first semiconductor layer 1a, and is electrically connected to the drain region 1f via the contact hole 41a that passes through the interlayer insulating film 41 and the gate insulating layer 2.

A transparent insulating film 49 formed from a silicon oxide film or the like and a transparent dielectric layer 40 are formed on the upper layer side (counter substrate 20 side) of the drain electrode 4a, and a capacitance line 5a is formed on the upper layer side of the dielectric layer 40. As the dielectric layer 40, it is possible to use a dielectric layer with a high dielectric constant, such as an aluminum oxide film, a titanium oxide film, a tantalum oxide film, a niobium oxide film, a hafnium oxide film, a lanthanum oxide film, and a zirconium oxide film, in addition to the silicon compounds such as a silicon oxide film and a silicon nitride film. The capacitance line 5a is formed from a conductive film, such as a conductive polysilicon film, a metal silicide film, a metal film, or a metal compound film. In the embodiment, the capacitance line 5a includes a 3 layer structure of a titanium nitride film, an aluminum film, and a titanium nitride film. The capacitance line 5a overlaps the drain electrode 4a via the dielectric layer 40, and configures the storage capacitor 55.

As shown in FIG. 7, the capacitance line 5a includes a main line part 5a1 extended straight in the X direction overlapping the scanning line 3a and two sub-line parts 5a2 and 5a3 extending so as to overlap the data line 6a at the intersection part with the data line 6a. The capacitance line 5a includes a rectangular portion 5a0 in at an intersection portion with the data line 6a. The drain electrode 4a includes a first band-like portion 4a1 extended in the X direction overlapping the capacitance line 5a and two second sub-line parts 4a2 and 4a3 extending so as to overlap the data line 6a at the intersection part with the data line 6a. The drain electrode 4a includes a rectangular portion 4a0 on the intersection portion with the data line 6a, and the entirety thereof overlaps the capacitance line 5a.

Also in FIG. 5A, an interlayer insulating film 42 is formed on the upper layer side (counter substrate 20 side) of the capacitance line 5a, and a data line 6a and a relay electrode 6b are formed in the same layer on the upper layer of the interlayer insulating film 42 (counter substrate 20 side). The interlayer insulating film 42 is formed from a silicon oxide film. The data line 6a and the relay electrode 6b are formed from a conductive film, such as a conductive polysilicon film, a metal silicide film, a metal film, or a metal compound film. In the embodiment, the data line 6a and the relay electrode 6b are formed from an aluminum alloy film or a laminated film with two to four layers of a titanium nitride film and an aluminum film. The data line 6a is electrically connected to the source region 1e (source drain region on data line side) via the contact hole 42a that passes through the interlayer insulating film 42, the insulating film 49, the interlayer insulating film 41 and the gate insulating layer 2. The relay electrode 6b is electrically connected to the drain electrode 4a via the contact hole 42b that passes through the interlayer insulating film 42 and the insulating film 49.

As shown in FIG. 8, the data line 6a extends straight in the Y direction, and the relay electrode 6b is formed at a position that overlaps the band-like portion 4a1 of the drain electrode 4a.

Also in FIG. 5A, a transparent interlayer insulating film 44 formed from a silicon oxide film, or the like, is formed on the upper layer side (counter substrate 20 side) of the data line 6a and the relay electrode 6b, and the surface (surface of counter substrate 20 side) of the interlayer insulating film 44 is planarized. The upper light blocking layer 7a and the relay electrode 7b are formed in the same layer on the upper layer side (counter substrate 20 side) of the interlayer insulating film 44. The interlayer insulating film 44 is formed from a silicon oxide film by a method such as a plasma CVD method in which tetraethoxysilane and oxygen gas are used or a plasma CVD method in which a silane gas and nitrous oxide are used, for example, and the surface thereof is planarized. The light blocking layer 7a and the relay electrode 7b are formed from a conductive film, such as a conductive polysilicon film, a metal silicide film, a metal film, or a metal compound film. In the embodiment, the light blocking layer 7a and the relay electrode 7b are formed from an aluminum alloy film or a laminated film of two to four layers of a titanium nitride film and an aluminum film. The relay electrode 7b is electrically connected to the relay electrode 6b via the contact hole 44a that passes through the interlayer insulating film 44. The upper light blocking layer 7a extends so as to overlap the data line 6a, and functions as a light blocking layer. The upper light blocking layer 7a is electrically connected to the capacitance line 5a, and used as a shielding layer.

As shown in FIG. 9, the upper light blocking layer 7a extends straight so as to overlap the data line 6a, and includes a rectangular portion 7a0 in a region that overlaps the scanning line 3a. The relay electrode 7b is formed at a position that overlaps the relay electrode 6b.

Also in FIG. 5A, a transparent interlayer insulating film 45 formed from a silicon oxide film, or the like, is formed on the upper layer side (counter substrate 20 side) of the upper light blocking layer 7a and the relay electrode 7b, and a first pixel electrode 9a formed from an ITO film or the like is formed on the upper layer side (counter substrate 20 side) of the interlayer insulating film 45. Accordingly, the second pixel electrode 9b and the third pixel electrode 9c described with reference to FIGS. 1A and 1B and 2 are also formed on the surface (surface of the counter substrate 20 side) of the interlayer insulating film 45, similarly to the first pixel electrode 9a.

A contact hole 45a that passes through the interlayer insulating film 45 and reaches the relay electrode 7b is formed in the interlayer insulating film 45, and the first pixel electrode 9a is electrically connected to the relay electrode 7b via the contact hole 45a. As a result, the first pixel electrode 9a is electrically connected to the drain region if via the relay electrode 7b, the relay electrode 6b and the drain electrode 4a. The interlayer insulating film 45 is formed from, for example, a silicon oxide film formed by a method such as a plasma CVD method in which tetraethoxysilane and oxygen gas are used or a plasma CVD method in which a silane gas and nitrous oxide are used. The interlayer insulating film 45 may include a structure with a lower first insulating film formed from non-silicate glass (NSG), and an upper second insulating film formed from boron silicate glass (BSG). In any case, the surface (surface of the counter substrate 20 side) of the interlayer insulating film 45 is planarized.

An alignment film 16 formed from polyimide or an inorganic alignment film is formed on the surface side of the first pixel electrode 9a. In the embodiment, the alignment film 16 is formed from an oblique deposition film (oblique vertical alignment film/inorganic alignment film), such as $SiO_x$ (X<2), $SiO_2$, $TiO_2$, $MgO$, $Al_2O_3$, $In_2O_3$, $Sb_2O_3$ or $Ta_2O_5$.

As shown in FIG. 10, the first pixel electrode 9a has a rectangular planar shape. In the embodiment, although the gap in the X direction is wider than the gap in the Y direction in adjacent first pixel electrodes 9a, a layout in which the gap in the Y direction is wider than the gap in the X direction or a layout in which the gap in the X direction is the same as the gap in the Y direction may be adopted.

Configuration of Counter Substrate 20

Also in FIG. 5A, in the counter substrate 20, the light blocking layer 29, the insulating film 28 formed from silicon oxide or the like, and the common electrode 21 formed from a transparent conductive film, such as an ITO film or the like are formed on the surface (one surface 20s opposing element substrate 10) on the liquid crystal layer 50 side of the transparent second substrate 20w (transparent substrate) such as a quartz substrate or a glass substrate, and an alignment film 26 formed from a polyimide or an inorganic alignment film is formed so as to cover the common electrode 21. In the embodiment, the common electrode 21 is formed from an ITO film. In the embodiment, the alignment film 26, similarly to the alignment film 16, is formed from an oblique deposition film (oblique vertical alignment film/inorganic alignment film), such as $SiO_x$ (X<2), $SiO_2$, $TiO_2$, $MgO$, $Al_2O_3$, $In_2O_3$, $Sb_2O_3$ or $Ta_2O_5$. The alignment films 16 and 26 obliquely vertically align the nematic liquid crystal compound with negative dielectric anisotropy used in the liquid crystal layer 50, and the liquid crystal panel 100p operates in a normally black VA mode. In the embodiment, an oblique deposition film of a silicon oxide film ($SiO_x$) from various inorganic alignment films is used as the alignment films 16 and 26.

Configuration of Dummy Pixel 100b

The dummy pixel 100b has the cross-sectional configuration shown in FIG. 5B. The dummy pixel 100b differs from the display pixel 100a only in the configuration between the interlayer insulating film 41 and the first substrate 10w, and the other configuration is the same. Accordingly, the same reference numerals are applied to the shared parts in the drawings, and description thereof will not be provided.

As shown in FIGS. 4 to 10, a second pixel electrode 9b is formed for each of the plurality of dummy pixels 100b on the one surface 10s opposing the counter substrate 20 (second substrate 20w), in the element substrate 10 (first substrate 10w), and the data line 6a and the scanning line 3a are formed along the interpixel region interposed by the adjacent second pixel electrodes 9b. The second transistor 30b is formed corresponding to the intersection of the data line 6a and the scanning line 3a, and, in the embodiment, the second transistor 30b is formed using the intersection region of the data line 6a and the scanning line 3a and the vicinity thereof.

The second pixel electrode 9b of the same layer as the first pixel electrode 9a of the display pixel 100a is formed in the dummy pixel 100b, and the data line 6a and the scanning line 3a are formed along the interpixel region interposed by the adjacent second pixel electrodes 9b. The second transistor 30b is formed corresponding to the intersection of the data line 6a and the scanning line 3a.

As shown in FIG. 5B, the scanning line 3a is also formed in the region in which the dummy pixel 100b is formed, similarly to the region in which the display pixel 100a is formed. The second transistor 30b including the second semiconductor layer 1b of the same layer as the first semiconductor layer 1a is formed on the surface side of the insulating film 12. The second transistor 30b includes a second semiconductor layer 1b in which the length direction faces in the extension direction of the data line 6a at a position that overlaps the data line 6a and the second gate electrode 8b that overlaps the center part in the length direction of the second semiconductor layer 1b, and the second gate electrode 8b and the first gate electrode 8a are the same layer. The second transistor 30b also has an LDD structure, similar to the first transistor 30a.

As shown in FIG. 6A, also in the region in which the dummy pixel 100b is formed, the scanning line 3a includes a main line part 3a1 extended straight in the X direction and two sub-line parts 3a2 and 3a3 extending so as to overlap the data line 6a at the intersection part with the data line 6a, similarly to the region in which the display pixel 100a is formed. The scanning line 3a includes a rectangular portion 3a0 in at an intersection portion with the data line 6a. As shown in FIGS. 6A and 6C, the second gate electrode 8b, similarly to the first gate electrode 8a, includes a first band-like portion 8b1 that overlaps the center part in the length direction of the second semiconductor layer 1b, and two second band-like portions 8b2 positioned at both sides in the X direction of the second semiconductor layer 1b and extend along the data line 6a from both ends of the first band-like portion 8b1, and the two second band-like portions 8b2 are electrically connected to the scanning line 3a via the two second contact holes 12b that pass through the gate insulating layer 2 and the insulating film 12.

The width dimension (dimension in the Y direction) of the scanning line 3a and the width dimension (dimension in the X direction) of the data line 6a and the like are the same in the dummy pixel 100b and the display pixel 100a. The planar sizes of the first semiconductor layer 1a and the second semiconductor layer 1b are the same, and the planar sizes of the first gate electrode 8a and the second gate electrode 8b are the same.

In the embodiment, the light blocking layer 3s of the same layer as the scanning line 3a is formed in a region that overlaps the second pixel electrode 9b, in the dummy pixel 100b. In the embodiment, although the light blocking layer 3s is formed leaving a gap between the light blocking layer 3s and each of the scanning line 3a and the data line 6a, the light blocking layer 3s substantially overlaps in all regions in which the scanning line 3a and the data line 6a do not overlap the light blocking layer 3s, among the second pixel electrode 9b. That is, the second pixel electrode 9b overlaps all regions of the opening region of the dummy pixel 100b. Since there is only several 11m between the light blocking layer 3s and each of the scanning line 3a and the data line 6a, the light blocking layer 3s has sufficient light blocking properties. Since the light blocking layer 3s is divided and formed in each dummy pixel 100b, it is possible to suppress the occurrence of stress in the light blocking layer 3s during the manufacturing step.

In the electro-optical device 100 configured in this way, as understood by comparison of the display pixel 100a shown in FIG. 6B and the dummy pixel 100b shown in FIG. 6C, the gap between the end portion of the second contact hole 12b and the end portion of the scanning line 3a is wider than the gap between the end portion of the first contact hole 12a and the end portion of the scanning line 3a in at least one direction from the X direction (extension direction of scanning line 3a) in which the scanning line 3a extends and the Y direction (width direction of scanning line 3a) that intersects the extension direction of the scanning line 3a. The first contact hole 12a and the second contact hole 12b differ on the dimension in the X direction and the dimension in the Y direction, and in the direction from the X direction and the Y direction in which the dimensions of the first contact hole 12a and the second contact hole 12b is large, the gap between the end portion of the second contact hole 12b and the end portion of the scanning line 3a are wider than the gap between the end portion of first contact hole 12a and the end portion of the scanning line 3a.

In the embodiment, because the dimension in the Y direction is larger than dimension in the X direction for first contact hole 12a and the second contact hole 12b, the gap Gb between the end portion in the Y direction of the second contact hole 12b and the end portion in the Y direction of the rectangular portion 3a0 of the scanning line 3a is wider than the gap Ga between the end portion in the Y direction of first contact hole 12a and the end portion in the Y direction of the rectangular portion 3a0 of the scanning line 3a.

That is, in the embodiment, because the dimensions in the Y direction are the same in the first gate electrode 8a and the second gate electrode 8b, the dimension in the Y direction of the second contact hole 12b becomes smaller than the dimension in the Y direction of the first contact hole 12a. In the embodiment, the gap Gb between the end portion in the Y direction of the second contact hole 12b and the end portion in the Y direction of the rectangular portion 3a0 of the scanning line 3a is 1.10 times or more and 1.50 times or less the gap Ga between the end portion in the Y direction of the first contact hole 12a and the end portion in the Y direction of the rectangular portion 3a0 of the scanning line 3a. The dimension in the X direction of the first contact hole 12a and the dimension in the X direction of the second contact hole 12b are the same. Therefore, the gap between the end portion in the X direction of the first contact hole 12a and the end portion in the X direction of the scanning line 3a is the same as the gap between the end portion in the X direction of the second contact hole 12b and the end portion in the X direction of the scanning line 3a.

Main Effects of Embodiment

As described above, in the electro-optical device 100 of the embodiment, a light blocking layer 3s that overlaps the second pixel electrode 9b is provided in the dummy pixel 100b provided in a region adjacent to the display region 10a. Therefore, it is possible to prevent pixel quality being lowered by light passing through the dummy pixel 100b.

In the dummy pixel 100b adjacent to the display region 10a, although exposure abnormalities occur stemming from rapid changes in the distribution of the light blocking layer 3s during exposure, and the second contact hole 12b that allows the scanning line 3a and the second gate electrode 8b to be electrically connected becomes larger than the design value, in the embodiment, the gap between the end portion of the second contact hole 12b and the end portion of the scanning line 3a is widened at the design stage so as to correct therefor. Therefore, even in a case in which the second contact hole 12b becomes larger than the design value, although the gap Gb between the end portion of the second contact hole 12b and the end portion of the rectangular portion 3a0 of the scanning line 3a is wider than the gap Ga between the end portion of the first contact hole 12a and the end portion of the rectangular portion 3a0 of the scanning line 3a, it is possible to ensure a sufficient gap between the end portion of the second contact hole 12b and the end portion of the scanning line 3a. Accordingly, the insulating film 12 (insulating film 12 between the second gate electrode 8b in the second contact hole 12b and the light blocking layer 3s) between the second contact hole 12b and the light blocking layer 3s is thick. Therefore, even if stress occurs between (periphery of the light blocking layer 3s) the second gate electrode 8b in the second contact hole 12b and the light blocking layer 3s for which the pattern is greatly different stemming from the thermal history in the manufacturing steps, it is possible to suppress the occurrence of cracks in the scanning line 3a since the stress is low. Accordingly, since it is difficult for breaks in the scanning line 3a to occur, it is possible to suppress the occurrence of defects stemming from breaks in the scanning line 3a.

In the embodiment, the gap Gb between the end portion of the second contact hole 12b and the end portion of the rectangular portion 3a0 of the scanning line 3a is wider than the gap Ga between the end portion of first contact hole 12a and the end portion of the rectangular portion 3a0 of the scanning line 3a in the Y direction in which the dimensions of the first contact hole 12a and the second contact hole 12b are large. Therefore, even if a lowering of the precision occurs during exposure, in the Y direction in which the influence is strong, since the gap Gb between the end portion of the second contact hole 12b and the end portion of the rectangular portion 3a0 of the scanning line 3a is wider than the gap Ga between the end portion of the first contact hole 12a and the end portion of the rectangular portion 3a0 of the scanning line 3a, it is difficult for defects stemming from exposure anomalies to occur.

In the embodiment, through making the first gate electrode 8a and the second gate electrode 8b have the same planar size, and the planar size of the second contact hole 12b smaller than the planar size of the first contact hole 12a, the gap Gb between the end portion of the second contact hole 12b and the end portion of the rectangular portion 3a0 of the scanning line 3a is made wider than the gap Ga between the end portion of first contact hole 12a and the end portion of the rectangular portion 3a0 of the scanning line 3a. Therefore, even if a large design modification is not performed, it is possible to widen the gap between the end portion of the second contact hole 12b and the end portion of the scanning line 3a.

The gap Gb between the end portion of the second contact hole 12b and the end portion of the rectangular portion 3a0 of the scanning line 3a is 1.10 times or more and 1.50 times or less the gap Ga between the end portion of the first contact hole 12a and the end portion of the rectangular portion 3a0 of the scanning line 3a. That is, the gap Gb between the end portion of the second contact hole 12b and the end portion of the rectangular portion 3a0 of the scanning line 3a is 1.50 times or less the gap Ga between the end portion of the first contact hole 12a and the end portion of the rectangular portion 3a0 of the scanning line 3a. Therefore, when the second contact hole 12b is too small, although the effect of preventing the infiltration of light to the second transistor 30b through the second contact hole 12b become smaller, if the above conditions are set, it is possible to prevent the infiltration of light to the second transistor 30b. Therefore, it is possible to prevent the occurrence or the like of bright spots stemming from the photoelectric current at the second transistor 30b.

In the embodiment, because the dimension of the second contact hole 12b is set smaller than the first contact hole 12a, even in a case in which the second contact hole 12b becomes larger than the design value, concavities stemming from the second contact hole 12b are small. Therefore, the influence on the storage capacitor 55 formed on the upper layer side (counter substrate 20 side) of the first contact hole 12a and the second contact hole 12b is small.

Because the scanning line 3a and the light blocking layer 3s are formed from the same layer, It is possible to form the scanning line 3a and the light blocking layer 3s at the same time.

Other Embodiments

In the embodiment, even in the dummy pixel 100b in either region of the region adjacent in the X direction with respect to the display region 10a and the region adjacent in the Y direction with respect to display region 10a, the gap Gb between the end portion of the second contact hole 12b and the end portion of the rectangular portion 3a0 of the scanning line 3a is made wider than the gap Ga between the end portion of first contact hole 12a and the end portion of the rectangular portion 3a0 of the scanning line 3a. However, in the dummy pixel 100b provided in one of the region adjacent in the X direction and the region adjacent in the Y direction with respect to display region 10a, the gap Gb between the end portion of the second contact hole 12b and the end portion of the rectangular portion 3a0 of the scanning line 3a may be wider than the gap Ga between the end portion of first contact hole 12a and the end portion of the rectangular portion 3a0 of the scanning line 3a. In the embodiment, the gap between the end portion of the second contact hole 12b and the end portion of the scanning line 3a in the Y direction from the X direction in which the scanning line 3a extends and the Y direction that intersects the extension direction of the scanning line 3a is made wider than the gap between the end portion of the first contact hole 12a and the end portion of the scanning line 3a. However, in both the X direction and the Y direction, the gap between the end portion of the second contact hole 12b and the end portion of the scanning line 3a may be made wider than the gap between the end portion of the first contact hole 12a and the end portion of the scanning line 3a. In a case in which the gap between the end portion of the first contact hole 12a and the end portion of the scanning line 3a is narrower in the X direction than in the Y direction, the gap between the end portion of the second contact hole 12b and the end portion of the scanning line 3a may be made wider than the gap between the end portion of the first contact hole 12a and the end portion of the scanning line 3a.

Example of Mounting to Electronic Device

Configuration Example of Projection-Type Display Device and Optical Unit

Figure 11:
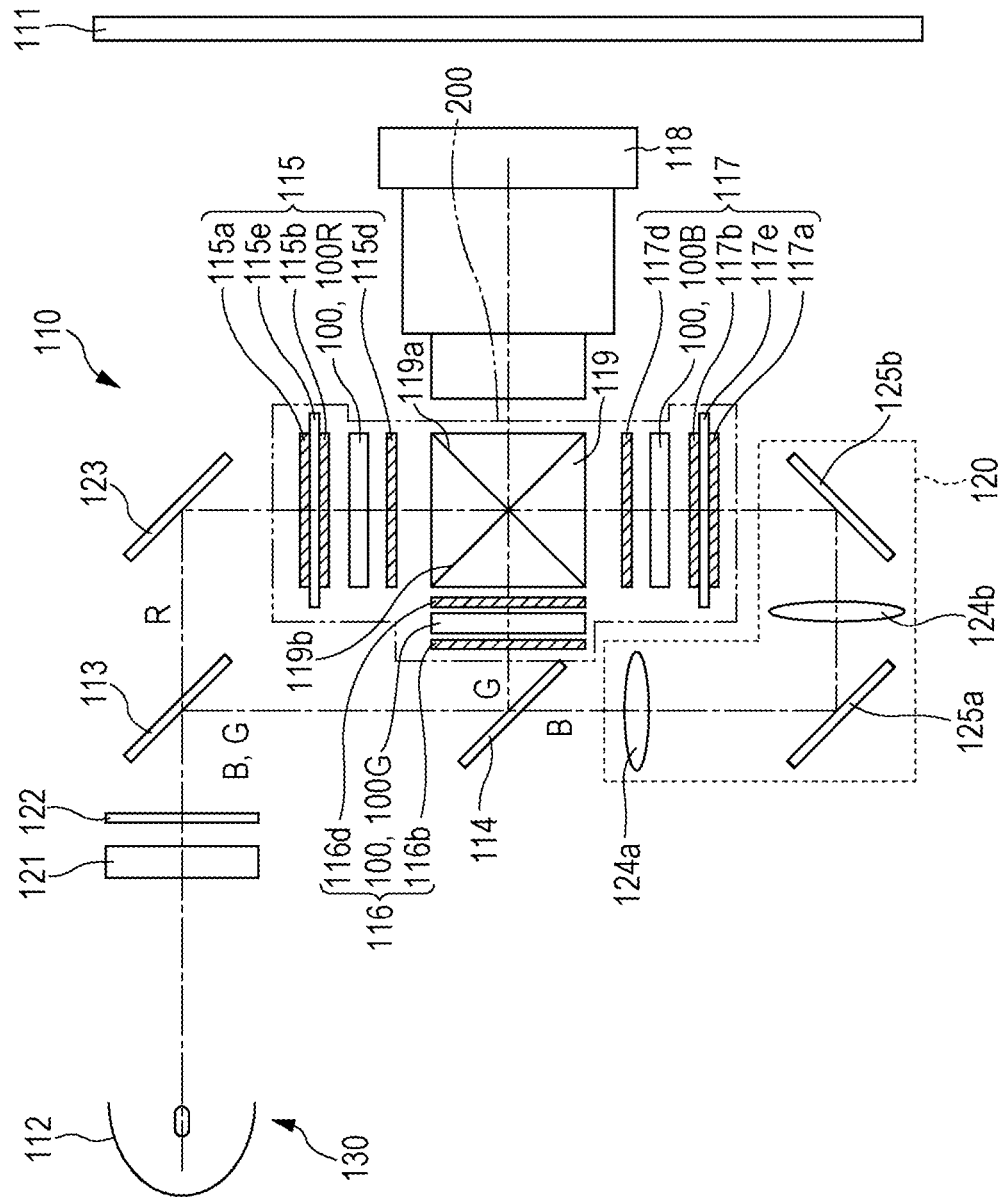
FIG. 11 is a schematic diagram illustrating a configuration of a projection-type display device (electronic apparatus) according to the embodiment of the invention.

FIG. 11 is a schematic diagram illustrating a configuration of a projection-type display device (electronic apparatus) according to the embodiment of the invention. The projection-type display device 110 as shown in FIG. 11 is a so-called projecting projection-type display device that irradiates a screen 111 provided on the observer side with light, and in which the light incident on the screen 111 is observed. The projection-type display device 110 includes a light source portion 130 including a light source 112, dichroic mirrors 113 and 114, liquid crystal light valves 115 to 117, a projection optical system 118, a cross dichroic prism 119 (synthetic optical system), and a relay system 120.

The light source 112 is configured by an ultra-high pressure mercury lamp that supplies light that includes red light R, green light G and blue light B. The dichroic mirror 113 is configured to allow the red light R from the light source 112 to pass through, and to reflect the green light G and the blue light B. The dichroic mirror 114 is configured to allow the blue light B from the green light G and blue light B reflected by the dichroic mirror 113 to pass through and reflect the green light G. In this way, the dichroic mirrors 113 and 114 configure a color separation optical system that separates light emitted from the light source 112 into the red light R, the green light G, and the blue light B.

An integrator 121 and a polarization conversion element 122 are arranged in order from the light source 112 between the dichroic mirror 113 and the light source 112. The integrator 121 is configured to uniformize the illuminance distribution of light irradiated from the light source 112. The polarization conversion element 122 is configured to convert light from the light source 112 into polarized light, for example, having a specified vibration direction, such as s polarization.

The liquid crystal light valve 115 is a transmissive-type electro-optical device that modulates, according to an image signal, red light transmitted through the dichroic mirror 113 and reflected by the reflection mirror 123. The liquid crystal light valve 115 includes a λ/2 phase difference plate 115a, a first polarization plate 115b, an electro-optical device 100 (red liquid crystal panel 100R), and a second polarization plate 115d. Even if the red light R incident on the liquid crystal light valve 115 passes through the dichroic mirror 113, since the polarization of the light does not change, the light remains polarized light.

The λ/2 phase difference plate 115a is an optical element that converts the s polarized light incident on the liquid crystal light valve 115 to p polarized light. The first polarization plate 115b is a polarization plate that blocks the s polarized light and allows the p polarized light to pass through. The electro-optical device 100 (red liquid crystal panel 100R) is configured to convert p polarized light to the s polarized light (circular polarization or elliptical polarization if half tone) through modulation according to the image signal. The second polarization plate 115d is a polarization plate that blocks the p polarized light and allows the s polarized light to pass through. Accordingly, the liquid crystal light valve 115 is configured to modulate the red light R according to the image signal, and emit the modulated red light R toward the cross dichroic prism 119.

The λ/2 phase difference plate 115a and the first polarization plate 115b are arranged in a state contacting the transparent glass plate 115e that does not convert the polarized light, and the λ/2 phase difference plate 115a and the first polarization plate 115b are able to avoid warping due to heating.

The liquid crystal light valve 116 is a transmissive-type electro-optical device that modulates, according to an image signal, green light G reflected by the dichroic mirror 114 after being reflected by the dichroic mirror 113. The liquid crystal light valve 116, similarly to the liquid crystal light valve 115, includes a first polarization plate 116b, an electro-optical device 100 (green liquid crystal panel 100G), and a second polarization plate 116d. The green light G incident on the liquid crystal light valve 116 is incident the s polarized light reflected by the dichroic mirrors 113 and 114. The first polarization plate 116b is a polarization plate that blocks the p polarized light and allows the s polarized light to pass through. The electro-optical device 100 (green liquid crystal panel 100G) is configured to convert the s polarized light into the p polarized light (circular polarization or elliptical polarization if half tone) through modulation according to the image signal. The second polarization plate 116d is a polarization plate that blocks the s polarized light and allows the p polarized light to pass through. Accordingly, the liquid crystal light valve 116 is configured to modulate the green light G according to the image signal, and emit the modulated green light G toward the cross dichroic prism 119.

The liquid crystal light valve 117 is a transmissive-type electro-optical device that modulates, according to an image signal, blue light B passing through the relay system 120 after being reflected by the dichroic mirror 113 and passing through the dichroic mirror 114. The liquid crystal light valve 117, similarly to the liquid crystal light valves 115 and 116, includes a λ/2 phase difference plate 117a, a first polarization plate 117b, an electro-optical device 100 (blue liquid crystal panel 100B), and a second polarization plate 117d. Since the blue light B incident on the liquid crystal light valve 117 is reflected by two reflection mirrors 125a and 125b, described later, of the relay system 120 after being reflected by the dichroic mirror 113 and passing through the dichroic mirror 114, the light becomes the s polarized light.

The λ/2 phase difference plate 117a is an optical element that converts the s polarized light incident on the liquid crystal light valve 117 to the p polarized light. The first polarization plate 117b is a polarization plate that blocks the s polarized light and allows the p polarized light to pass through. The electro-optical device 100 (blue liquid crystal panel 100B) is configured to convert the p polarized light into the s polarized light (circular polarization or elliptical polarization if half tone) through modulation according to the image signal. The second polarization plate 117d is a polarization plate that blocks the p polarized light and allows the s polarized light to pass through. Accordingly, the liquid crystal light valve 117 is configured to modulate the blue light B according to the image signal, and emit the modulated blue light B toward the cross dichroic prism 119. The λ/2 phase difference plate 117a and the first polarization plate 117b are arranged in a state contacting the transparent glass plate 117e.

The relay system 120 includes relay lenses 124a and 124b and reflection mirrors 125a and 125b. The relay lenses 124a and 124b are provided to prevent light loss due to the length of the optical path of the blue light B. The relay lens 124a is arranged between the dichroic mirror 114 and the reflection mirror 125a. The relay lens 124b is arranged between the reflection mirrors 125a and 125b. The reflection mirror 125a is arranged so as to reflect the blue light B passing through the dichroic mirror 114 and emitted from the relay lens 124a toward the relay lens 124b. The reflection mirror 125b is arranged so as to reflect the blue light B emitted from the relay lens 124b toward the liquid crystal light valve 117.

The cross dichroic prism 119 is a color synthesizing optical system in which two dichroic films 119a and 119b are arranged intersecting in an X-form. The dichroic film 119a is a film that reflects blue light B and transmits green light G, and the dichroic film 119b is a film that reflects red light R and transmits green light G. Accordingly, the cross dichroic prism 119 is configured so as to synthesize the red light R, the green light G, and the blue light B modulated by each of the liquid crystal light valves 115 to 117, and emit the synthesized light toward the projection optical system 118.

The light incident on the cross dichroic prism 119 from the liquid crystal light valves 115 and 117 is the s polarized light, and the light incident on the cross dichroic prism 119 from the liquid crystal light valve 116 is the p polarized light. The light incident from each of the liquid crystal light valves 115 to 117 in the cross dichroic prism 119 is synthesized by giving the light incident on cross dichroic prism 119 different types of polarization. In general, the dichroic films 119a and 119b have excellent s polarization reflection transistor characteristics. Therefore, the red light R and the blue light B reflected by the dichroic films 119a and 119b are made the s polarized light, and the green light G that passes through the dichroic films 119a and 119b is made the p polarized light. The projection optical system 118 includes a projection lens (not shown), and is configured so as to project light synthesized by the cross dichroic prism 119 on the screen 111.

Other Projection-Type Display Device

The projection-type display device may be configured to use LED light sources that emit each color of light as the power source portion and supply the each color of light emitted from the LED light sources to separate respective electro-optical devices.

Other Electronic Apparatuses

The electro-optical device 100 in which the embodiment of the invention is applied may be used, in addition to the above electronic apparatus, as a direct viewing-type display device in an electronic apparatus such as a portable telephone, a mobile information terminal (Personal Digital Assistant: PDA), a digital camera, a liquid crystal television, a car navigation device, a video telephone, a POS terminal, and an apparatus including a touch panel.

The entire disclosure of Japanese Patent Application No. 2013-213467, filed Oct. 11, 2013 is expressly incorporated by reference herein.

What is claimed is:

1. An electro-optical device comprising:
    a scanning line provided between a substrate and an insulating film;
    a display pixel that includes a first transistor provided on a side of the insulating film opposite to the scanning line and a first pixel electrode electrically connected to the first transistor, in a display region; and
    a dummy pixel that includes a second transistor provided on a side of the insulating film opposite to the scanning line, a second pixel electrode electrically connected to the second transistor, and a light blocking layer that overlaps the second pixel electrode between the substrate and the insulating film, in an area adjacent to the display region,
    wherein the first transistor includes a first gate electrode electrically connected via a first contact hole formed in the insulating film,
    the second transistor includes a second gate electrode that is electrically connected via a second contact hole formed in the insulating film, and
    a gap between an end portion of the second contact hole and an end portion of the scanning line is wider than a gap between an end portion of the first contact hole and an end portion of the scanning line in at least one of a first direction in which the scanning line extends and a second direction which intersects the extension direction of the scanning line.

2. The electro-optical device according to claim 1,
    wherein a dimension in the first direction and a dimension in the second direction of first contact hole and the second contact hole are different, and
    a gap between an end portion of the second contact hole and an end portion of the scanning line is wider than a gap between an end portion of the first contact hole and an end portion of the scanning line in a direction of the larger dimension of the first direction and the second direction.

3. The electro-optical device according to claim 1,
    wherein the gap between the end portion of the second contact hole and the end portion of the scanning line in the second direction is wider than the gap between the end portion of the first contact hole and the end portion of the scanning line.

4. The electro-optical device according to claim 1,
    wherein the gap between the end portion of the second contact hole and the end portion of the scanning line is 1.10 times or more and 1.50 times or less the gap between the end portion of the first contact hole and the end portion of the scanning line.

5. The electro-optical device according to claim 1,
    wherein the planar sizes of the first gate electrode and the second gate electrode are the same, and
    the planar size of the second contact hole is smaller than the planar size of the first contact hole.

6. The electro-optical device according to claim 1,
    wherein the first contact hole is provided at two locations on both sides of the first transistor that interpose the semiconductor layer therebetween, and
    the second contact hole is provided at two locations on both sides of the second transistor that interpose the semiconductor layer therebetween.

7. The electro-optical device according to claim 1,
    wherein the scanning line and the light blocking layer are formed from the same light blocking film.

8. An electronic apparatus comprising the electro-optical device according to claim 1.

9. An electronic apparatus comprising the electro-optical device according to claim 2.

10. An electronic apparatus comprising the electro-optical device according to claim 3.

11. An electronic apparatus comprising the electro-optical device according to claim 4.

12. An electronic apparatus comprising the electro-optical device according to claim 5.

13. An electronic apparatus comprising the electro-optical device according to claim 6.

14. An electronic apparatus comprising the electro-optical device according to claim 7.

* * * * *